(12) United States Patent
Zhang et al.

(10) Patent No.: US 12,520,488 B2
(45) Date of Patent: Jan. 6, 2026

(54) THREE-DIMENSIONAL MEMORY DEVICE AND FABRICATION METHOD FOR IMPROVED YIELD AND RELIABILITY

(71) Applicant: Yangtze Memory Technologies Co., Ltd., Wuhan (CN)

(72) Inventors: Kun Zhang, Wuhan (CN); Wenxi Zhou, Wuhan (CN); Linchun Wu, Wuhan (CN); Yuhui Han, Wuhan (CN); Changzhi Sun, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 449 days.

(21) Appl. No.: 18/082,080

(22) Filed: Dec. 15, 2022

(65) Prior Publication Data

US 2024/0179901 A1   May 30, 2024

(30) Foreign Application Priority Data

Nov. 25, 2022   (CN) .......................... 202211492886.7

(51) Int. Cl.
*H10B 43/20* (2023.01)
*H10D 30/69* (2025.01)
*H10D 64/01* (2025.01)

(52) U.S. Cl.
CPC ........... *H10B 43/20* (2023.02); *H10D 30/693* (2025.01); *H10D 30/697* (2025.01); *H10D 64/037* (2025.01)

(58) Field of Classification Search
CPC .... H10B 43/20; H10D 64/037; H10D 30/693; H10D 30/697
See application file for complete search history.

(56) References Cited

U.S. PATENT DOCUMENTS

| | | | |
|---|---|---|---|
| 2019/0326314 A1* | 10/2019 | Xiao | H10B 43/35 |
| 2020/0135753 A1* | 4/2020 | Zhang | H10B 43/10 |
| 2021/0104547 A1* | 4/2021 | Xiao | H10D 64/037 |

\* cited by examiner

*Primary Examiner* — Richard A Booth
(74) *Attorney, Agent, or Firm* — Anova Law Group, PLLC

(57) ABSTRACT

A 3D memory device includes a conductor/insulator stack containing a conductive layer and a dielectric layer alternatingly stacked, channel hole structures in a first region of memory cells in the conductor/insulator stack, a blocking structure adjacent to the first region, and a dummy channel hole structure in the first region. The dummy channel hole structure is adjacent to the blocking structure, and includes a dielectric material that fills a channel hole to form a first dielectric filling structure.

14 Claims, 18 Drawing Sheets

THREE-DIMENSIONAL MEMORY DEVICE AND FABRICATION METHOD FOR IMPROVED YIELD AND RELIABILITY

CROSS-REFERENCE TO RELATED APPLICATION

This application claims the priority of Chinese Patent Application No. 202211492886.7, filed on Nov. 25, 2022, the content of which is incorporated herein by reference in its entirety.

FIELD OF THE TECHNOLOGY

This application relates to the field of semiconductor technology and, specifically, to a three-dimensional (3D) memory device and fabrication method for improved yield and reliability.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

In some cases, a 3D NAND memory device contains multiple stacks that are formed sequentially on a substrate. Each stack contains layers of memory cells. As more and more layers of memory cells are added, certain yield and reliability issues become challenging. The disclosed memory structures and methods may improve certain aspects of 3D NAND memory devices and fabrication process.

SUMMARY

In one aspect of the present disclosure, a 3D memory device includes a conductor/insulator stack containing a conductive layer and a dielectric layer alternatingly stacked, channel hole structures in a first region of memory cells in the conductor/insulator stack, a gate line slit (GLS) structure, a blocking structure, and a first dummy channel hole structure. The GLS structure is adjacent to the first region, and extends through the conductor/insulator stack and along a first direction. The blocking structure is adjacent to the first region, and extends through the conductor/insulator stack and along a second direction. The first and second directions are perpendicular to each other. The first dummy channel hole structure is in the first region and adjacent to the blocking structure, extends through the conductor/insulator stack, and includes one or more dielectric materials that fill a channel hole to form a first dielectric filling structure.

In another aspect of the present disclosure, a 3D memory device includes a conductor/insulator stack including a conductive layer and a dielectric layer alternatingly stacked, channel hole structures in a first region of memory cells in the conductor/insulator stack, a GLS structure adjacent to the first region and extending along a first direction, a blocking structure separating the first region and a second region and extending along a second direction, and a first dummy channel hole structure in the first region. The first and second directions are perpendicular to each other. The first dummy channel hole structure includes one or more dielectric materials that fill a channel hole to form a first dielectric filling structure.

In another aspect of the present disclosure, a method for fabricating a 3D memory device includes forming a dielectric stack, filling a channel hole with one or more dielectric materials to form a first dielectric filling structure, forming a GLS structure through the conductor/insulator stack and extending along a first direction, and forming a blocking structure. A first dummy channel hole structure includes the first dielectric filling structure in the channel hole and extends through the dielectric stack. The blocking structure is adjacent to the first dummy channel hole structure, and extends through the dielectric stack and along a second direction. The first and second directions are perpendicular to each other. The dielectric stack includes a first dielectric layer and a second dielectric layer alternately stacked.

In another aspect of the present disclosure, a system includes a memory device and a memory controller for controlling the memory device. The memory device includes a conductor/insulator stack containing a conductive layer and a dielectric layer alternatingly stacked, channel hole structures in a first region of memory cells in the conductor/insulator stack, a GLS structure, a blocking structure, and a first dummy channel hole structure. The GLS structure is adjacent to the first region, and extends through the conductor/insulator stack and along a first direction. The blocking structure is adjacent to the first region, and extends through the conductor/insulator stack and along a second direction. The first and second directions are perpendicular to each other. The first dummy channel hole structure is in the first region and adjacent to the blocking structure, extends through the conductor/insulator stack, and includes one or more dielectric materials that fill a channel hole to form a first dielectric filling structure.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

Figure 1A:
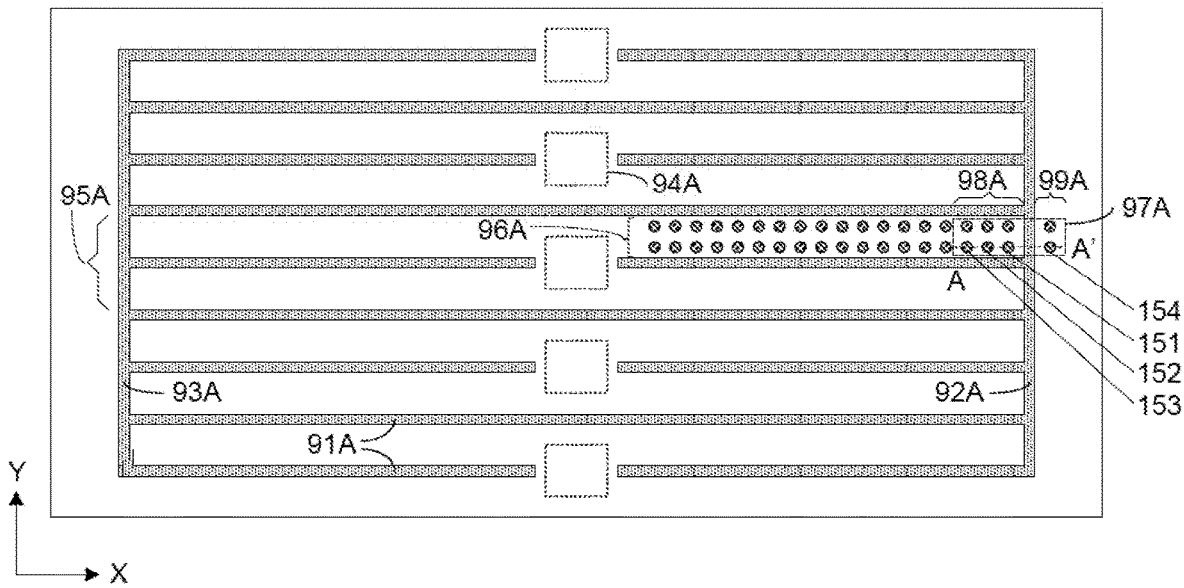
FIGS. 1A and 1B illustrate plan views of exemplary 3D array devices according to various aspects of the present disclosure.

FIG. 1A shows a plan view 90A of a 3D array device according to aspects of the present disclosure. The plan view is in an X-Y plane. The 3D array device has a great number of channel hole structures arranged in memory planes. Each memory plane is divided into memory blocks and memory fingers by GLS structures. The plan view 90A shows an exemplary memory plane that contains GLS structures 91A extending in the X direction and GLS structures 92A and 93A extending in the Y direction. The GLS structure 91A is perpendicular to the GLS structures 92A and 93A. Staircase contact (SCT) structures are configured in SCT regions 94A. The region 94A is arranged in a memory block, e.g., a central region of a memory block. Some GLS structures 91A extend between the GLS structures 92A and 93A. Some GLS structures 91A extend between an SCT region 94A and the GLS structure 92A or 93A. As an example, a memory block 95A has four memory fingers including a memory finger 96A. The memory finger 96A is adjacent to and between two GLS structures 91A, and exemplarily contains two rows of channel hole structures that are represented by small circles. Channel hole structures in other memory fingers are not shown in FIG. 1A for simplicity. A region 97A includes sections 98A and 99A. The section 98A is a part of the memory finger 96A. The GLS structure 92A is adjacent to and separates the sections 98A and 99A. Channel hole structures 151-154 are arranged in sections 98A and 99A and along a line AA'. In certain aspects, channel hole structures in the section 99A are not configured for constructing memory cells.

Figure 1B:
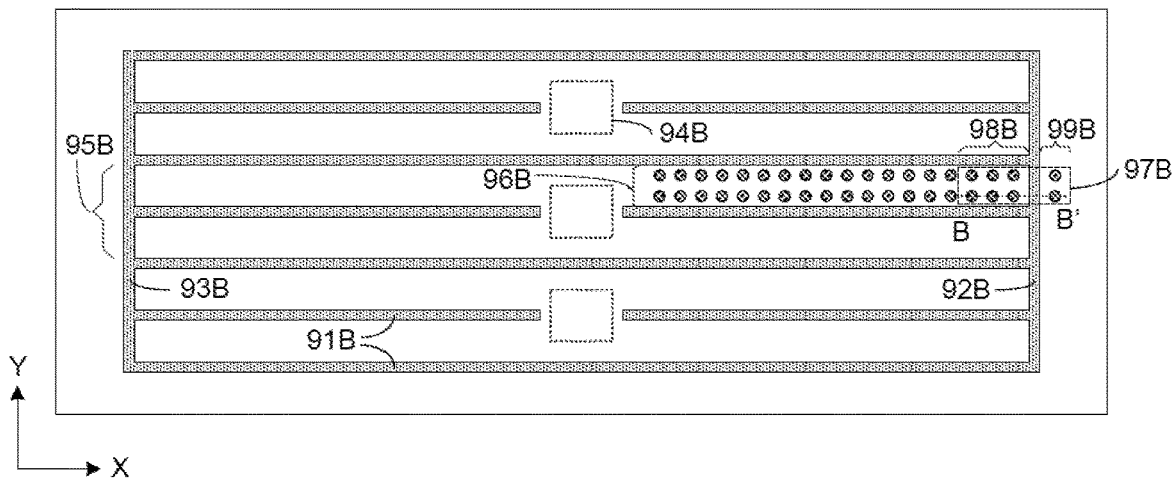

FIG. 1B shows a plan view 90B of another exemplary 3D array device in an X-Y plane according to aspects of the present disclosure. The plan view 90B depicts an exemplary memory plane that contains GLS structures 91B parallel to the X axis and GLS structures 92B and 93B parallel to the Y axis. SCT structures are configured in SCT regions 94B. The region 94B is arranged in a memory block, e.g., a central region of a memory block. Some GLS structures 91B extend between the GLS structures 92B and 93B. Some GLS structures 91B extend between an SCT region 94B and the GLS structure 92B or 93B. As an example, a memory block 95B has four memory fingers including a memory finger 96B. Channel hole structures in the memory finger 96B are depicted exemplarily, while channel hole structures in other memory fingers are omitted for simplicity. A region 97B includes sections 98B and 99B separated by the GLS structure 92B. The section 98B is a part of the memory finger 96B. Similar to the line AA' of FIG. 1A, a line BB' goes through three channel hole structures in the section 98B and one channel hole structure in the section 99B.

The memory planes shown in the plan views 90A and 90B are similar in certain aspects, such as the configuration of certain memory blocks and memory fingers. One difference between these memory planes is the arrangement of the GLS structures 91A and 91B in the boundary regions. The boundary GLS structures 91A in the plan view 90A extend between an SCT region 94A and an edge of the plane (e.g., the GLS structure 92A or 93A), while the boundary GLS structures 91B in the plan view 90B extend between edges of the plane. The quantity, dimension, and arrangement of the memory blocks, memory fingers, channel hole structures, and GLS structures shown in FIGS. 1A and 1B and in other figures in the present disclosure are exemplary and for description purposes. The memory finger 96A or 96B may represent any memory finger of the memory planes that is aligned with it along the Y direction. Further, illustrations regarding structures and fabrication methods in respect to channel hole structures along the line AA' of FIG. 1A apply to those in respect to channel hole structures along the line BB' of FIG. 1B.

The GLS structure 92A, 93A, 92B, and 93B may also be referred to as blocking structures. The blocking structure may represent a boundary of a memory plane and/or memory block in some cases, as it separates a memory plane from another memory plane, or separates a memory block from another memory block.

FIGS. 2A-25 schematically show cross-sectional views of certain fabrication processes for 3D array structures 100A, 100B, and 100C according to aspects of the present disclosure. The 3D array structures 100A-100C each are a part of a memory device and may also be referred to as a 3D memory structure. Among the figures, the cross-sectional views are in X-Z planes and taken along the line AA' of FIG. 1A.

Figure 2A:
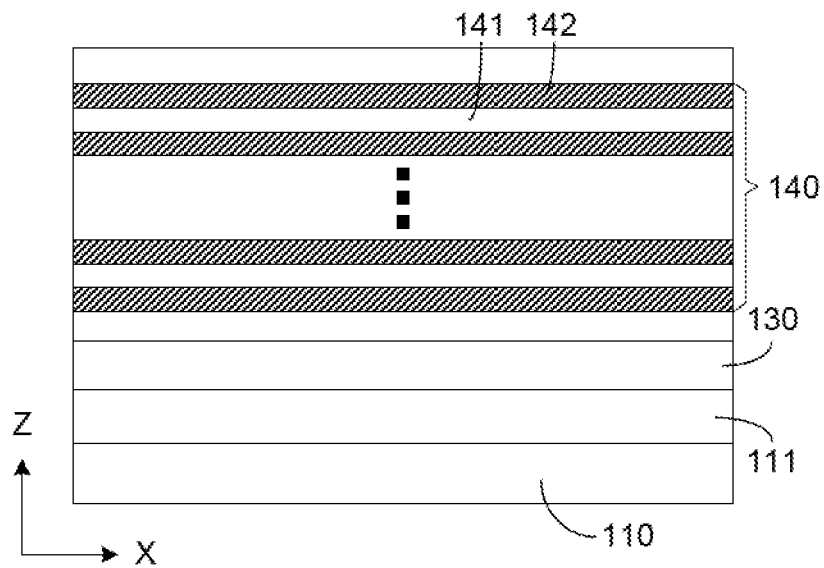
FIG. 2A illustrates a cross-sectional view of a structure of an exemplary 3D array device at a certain stage during a fabrication process according to various aspects of the present disclosure.

FIG. 2A shows a cross-sectional view at an early stage of a fabrication process. A structure includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a top portion of the substrate 110 is doped by n-type dopants via ion implantation and/or diffusion to form a doped region 111. The dopants of the doped region 111 may include, for example, phosphorus (P), arsenic (As), and/or antimony (Sb).

Further, a sacrificial layer 130 is deposited over the doped region 111. The sacrificial layer 130 may include a dielectric material, a semiconductor material, or a conductive material. The word "conductive", as used herein, indicates electrically conductive of a material. An exemplary material for the sacrificial layer 130 is polysilicon.

After the polysilicon sacrificial layer 130 is formed, a dielectric stack 140 is formed. The dielectric stack 140 may be considered as a dielectric stack structure that includes multiple pairs of stack layers, for example, including first dielectric layers 141 and second dielectric layers 142, stacked alternately over each other. Some layers of the dielectric stack 140 are used to form memory cells. For example, the layers for fabricating memory cells may include 64 pairs, 128 pairs, or more than 128 pairs of the first and second dielectric layers 141 and 142. In some cases, a stack (such as the dielectric stack 140) may be referred to as a deck.

In some aspects, the first dielectric layer 141 and the second dielectric layer 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductive stack layer. The sacrificial layer 130, first dielectric layers 141, and second dielectric layers 142 may be deposited by chemical vapor deposition (CVD), physical vapor deposition (PVD), atomic layer deposition (ALD), or a combination thereof.

Figure 2B:
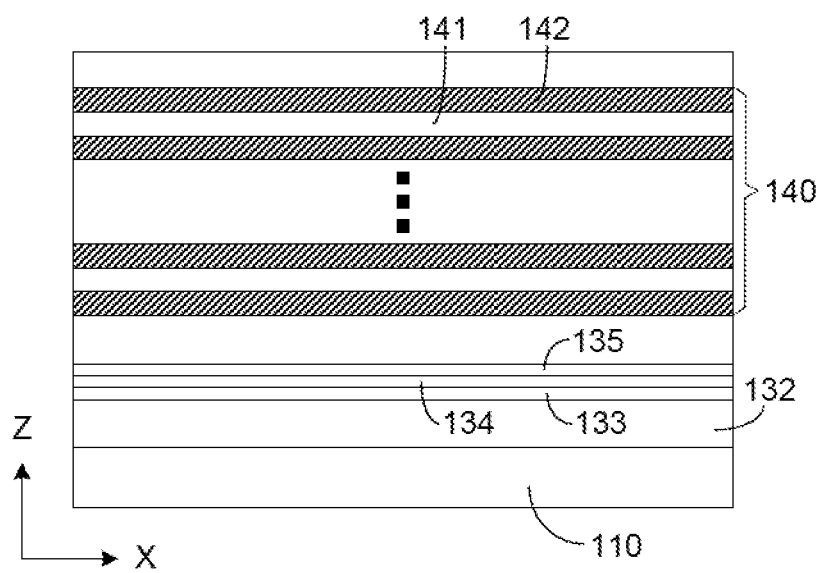
FIG. 2B illustrates a cross-sectional view of a structure of another exemplary 3D array device at a certain stage of a fabrication process according to various aspects of the present disclosure.

FIG. 2B shows a cross-sectional view at an early stage of another fabrication process. Provided the substrate 110 and dielectric stack 140 shown in FIG. 2B are the same as or similar to those shown in FIG. 2A. In some cases, a layer 132 (e.g., a polysilicon layer) may be deposited over the substrate 110. Further, layers 133, 134, and 135 may be grown sequentially over the layer 132. Optionally, the layers 133, 134, and 135 may be a silicon oxide layer, a silicon nitride layer, and a polysilicon layer, respectively. In certain aspects, the layers 132-134 may be sacrificial layers and etched away at a certain stage. The dielectric stack 140 is constructed over the layers 132-135. The layers may be deposited by CVD, PVD, ALD, or a combination thereof.

Figure 3:
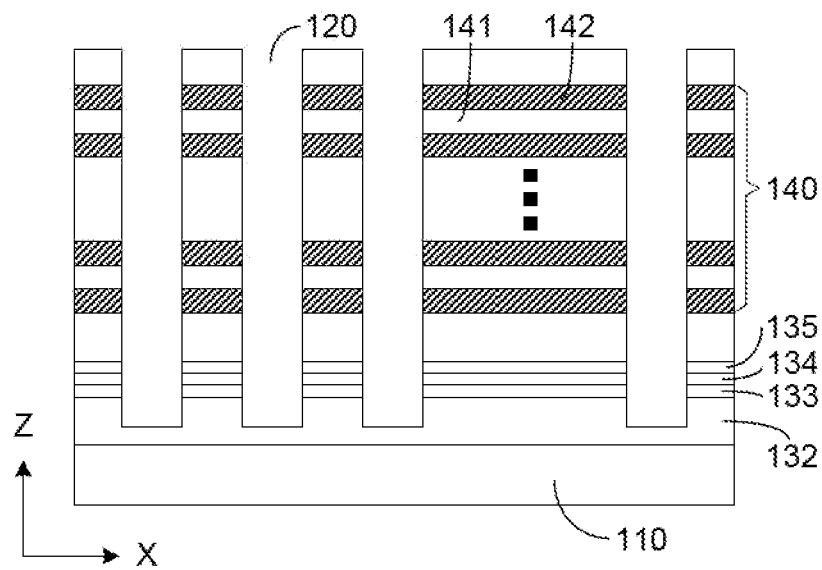
FIGS. 3, 4, and 5 illustrate cross-sectional views of the 3D array device shown in FIG. 2B at certain stages according to various aspects of the present disclosure.

FIG. 3 show a schematic cross-sectional view of the structure as shown in FIG. 2B after an etch process according to aspects of the present disclosure. Openings 120 are formed by a dry etch process or a combination of dry and wet etch processes. The opening 120 may be considered as a channel hole or a section of a channel hole. A channel hole is made for forming a channel hole structure or dummy channel hole structure. The term "dummy channel hole structure" as used herein indicates a structure that is made to fill a channel hole but not used as a channel hole structure. A dummy channel hole structure may have any structure including a part of a channel hole structure. Positions of the openings 120 in an X-Y plane correspond to that of the channel hole structures 151-154 as shown in FIG. 1A. The opening 120 may have a cylindrical shape or pillar shape and extend in the Z direction or a direction approximately perpendicular to the substrate 110. Optionally, the opening 120 passes through the dielectric stack 140 and layers 133-135, and partially penetrates the layer 132. The first and second dielectric layers 141 and 142, and layers 132-135 are exposed on the sidewall and bottom of the opening 120.

Figure 4:
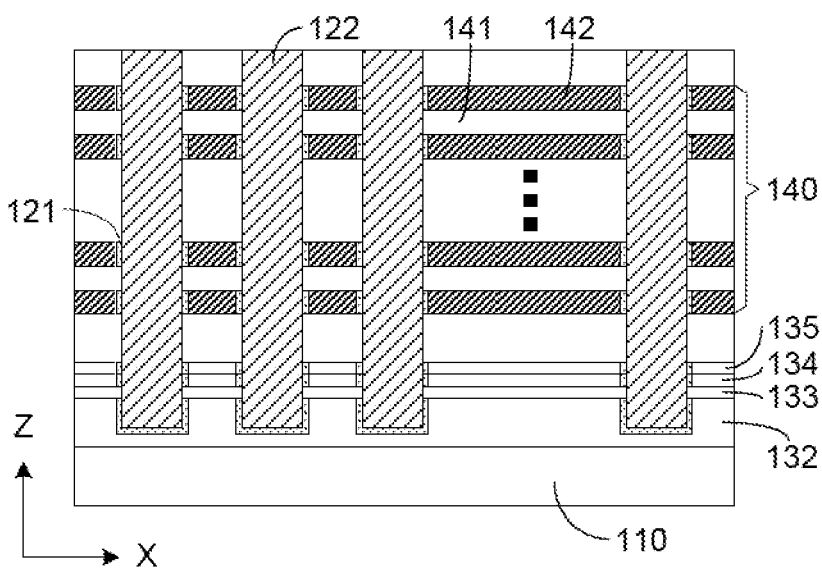

In some embodiments, an oxidation process is performed. As aforementioned, the second dielectric layer 142 and layer 134 are silicon nitride and the layers 132 and 135 are polysilicon. The exposed portions of these layers are changed into silicon oxide. For example, exposed parts of the second dielectric layers 142 become silicon oxide regions 121. In some other embodiments, the oxidation process is not performed. Further, CVD and/or ALD is performed to fill the openings 120 with a material such as polysilicon or carbon. Filling structures 122 are formed in the openings 120, as shown in FIG. 4. The term "filling structure" as used herein indicates a structure that is made in an opening or cavity for filling the opening or cavity. A filling structure may be formed by depositing one or more materials in an opening or cavity.

Figure 5:
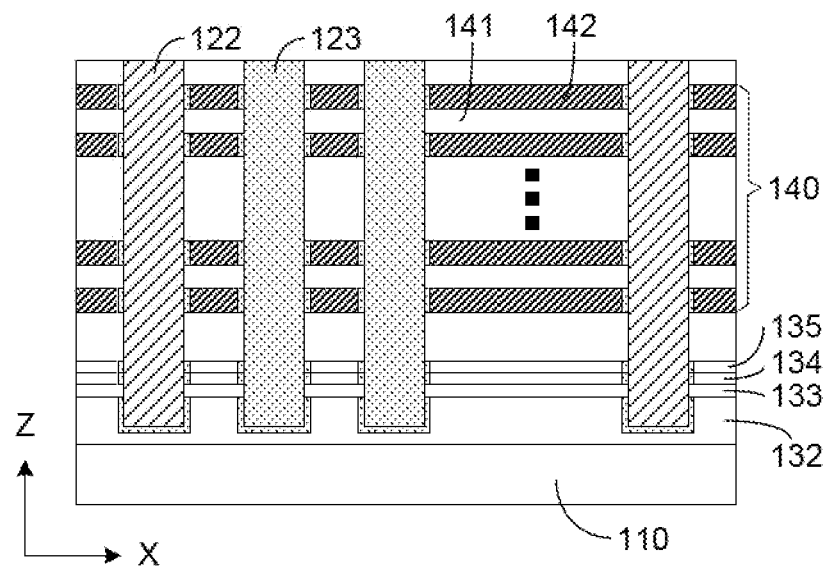

The two filling structures 122 in the middle are removed in a selective etch, e.g., a selective wet etch, followed by a CVD and/or ALD process to fill the openings with one or more dielectric materials (e.g., silicon oxide). FIG. 5 shows dielectric filling structures 123 that are formed by the deposition schematically. The filling structure 123 extends or passes through the dielectric stack 140 and is a part of a dummy channel hole structure. Optionally, a flattening process such as chemical mechanical polishing (CMP) is performed to remove protrusion features of the surface.

Figure 6:
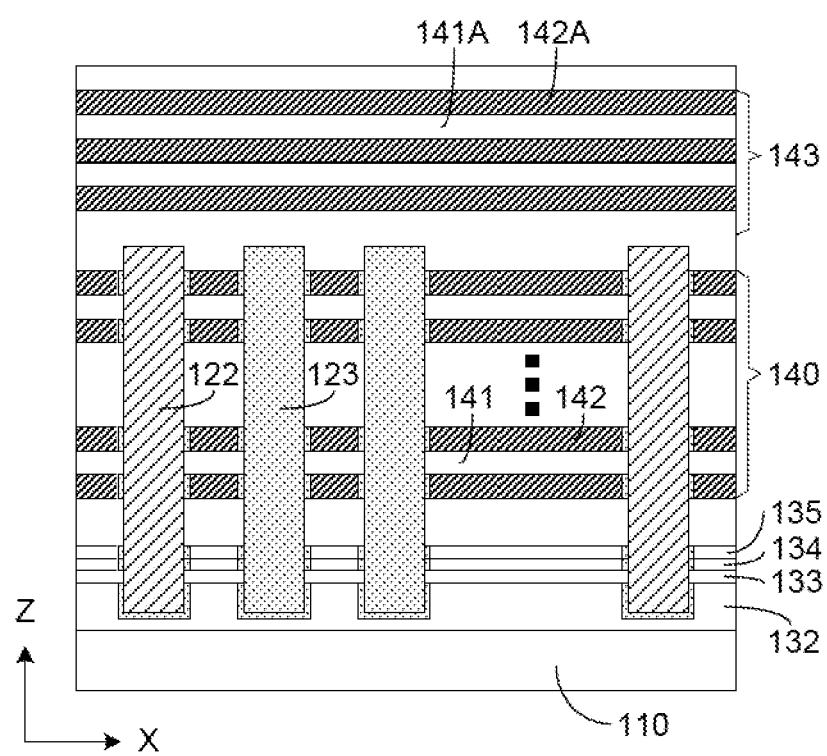
FIGS. 6, 7, and 8 illustrate cross-sectional views of the 3D array device shown in FIG. 5 after another deck is made according to various aspects of the present disclosure.

In certain embodiments, in order to increase the layers of memory cells, a dielectric stack 143 is formed over the dielectric stack 140, which is illustrated in FIG. 6. The dielectric stack 143, as another deck, is aligned to the stack 140 along the Z direction or a direction approximately perpendicular to the substrate 110. Similar to the dielectric stack 140, the stack 143 includes multiple pairs of stack layers, for example, including third dielectric layers 141A and fourth dielectric layers 142A, stacked alternately over each other. In some cases, the layers for fabricating memory cells may include 64 pairs, 128 pairs, or more than 128 pairs of the third and fourth dielectric layers 141A and 142A.

Optionally, the third dielectric layer 141A includes a silicon oxide layer, which may be used as an isolation stack layer, while the fourth dielectric layer 142A includes a silicon nitride layer, which may be used as a sacrificial stack layer. The third and fourth dielectric layers 141A and 142A may be deposited via CVD, PVD, ALD, or a combination thereof.

Figure 7:
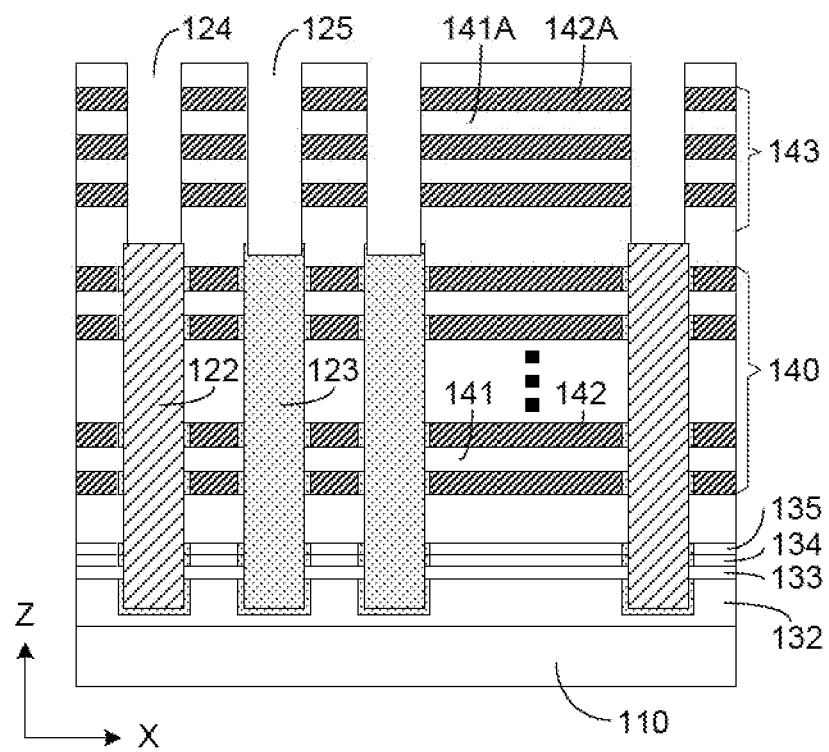

FIG. 7 shows a schematic cross-sectional view of the structure shown in FIG. 6 after openings 124 and 125 are etched according to aspects of the present disclosure. The openings 124 and 125 may be formed simultaneously by, for example, a dry etch process or a combination of dry and wet etch processes. The openings 124 and 125 are channel holes through the dielectric stack 143. Channel holes in the dielectric stack 143 are aligned to positions of channel holes in the dielectric stack 140. For example, the openings 124 and 125, extending through the dielectric stack 143, are aligned to the filling structures 122 and 123, respectively.

At the bottom of the opening 124 and 125, the filling structures 122 and 123 are exposed. Since the openings 124 and 125 have a taper angle (not shown), the horizontal dimension of the openings decreases gradually from the top to the bottom. In some cases, the horizontal dimension of the openings 124 and 125 is smaller than that of the filling structures 122 and 123 at the bottoms of the openings. Further, when the filling structures 122 and 123 are made from different materials, the openings 124 and 125 may have different values of depth. In some cases, the opening 125 may be deeper than the opening 124.

After the openings 124 and 125 are formed, a selective etch (e.g., selective wet etch) is performed to removed the filling structures 122. The openings 124 are extended to pass through the dielectric stacks 140 and 143 in the Z direction, while the openings 125 remain relatively unchanged. The extended opening 124 combines channel holes from the two dielectric stacks. The extended openings 124 and openings 125 are configured for making channel hole structures and dummy channel hole structures.

Figure 8:
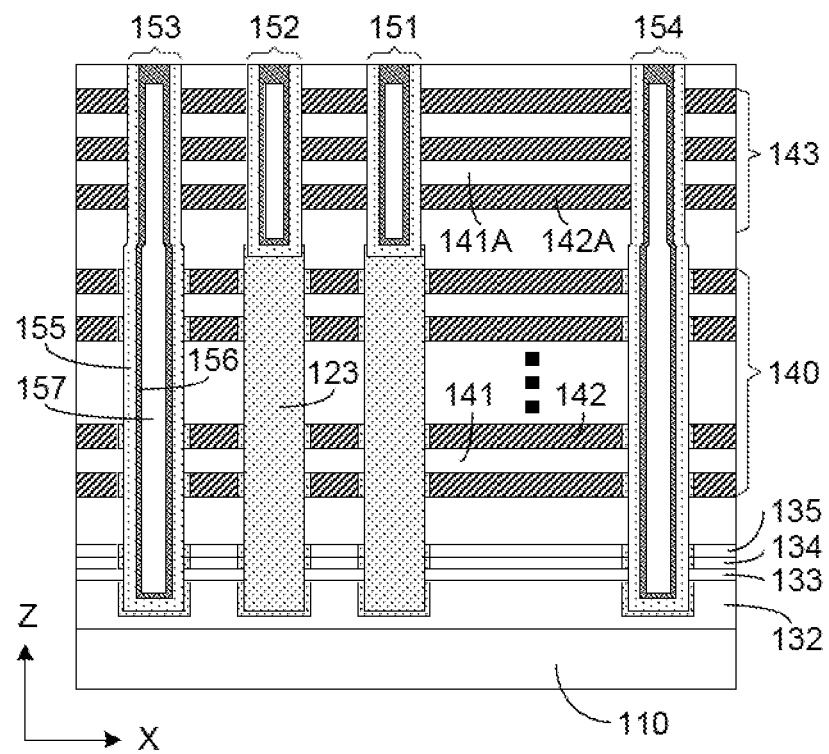

FIG. 8 shows a schematic cross-sectional view of the structure shown in FIG. 7 after the channel hole structures 151-154 are made according to aspects of the present disclosure. A functional layer 155 is deposited on the sidewall and bottom of the channel hole. The functional layer 155 includes a blocking layer (not shown) formed on the sidewall and bottom of the channel hole to block an outflow of charges, a charge trap layer (not shown) formed on a surface of the blocking layer to store charges, and a tunneling layer (not shown) formed on a surface of the charge trap layer. The blocking layer may include one or more layers that may include one or more materials. The material for the blocking layer may include silicon oxide, silicon nitride, silicon oxynitride, a high-k dielectric material such as aluminum oxide or hafnium oxide, or another wide bandgap material. The charge trap layer may include one or more layers that may include one or more materials. The materials for the charge trap layer may include polysilicon, silicon nitride, silicon oxynitride, nanocrystalline silicon, a high-k dielectric material such as aluminum oxide or hafnium oxide, or another wide bandgap material. The tunneling layer may include one or more layers that may include one or more materials. The material for the tunneling layer may include silicon oxide, silicon nitride, silicon oxynitride, a high-k dielectric material such as aluminum oxide or hafnium oxide, or another wide bandgap material.

Further, a semiconductor channel 156 is deposited on a surface of the tunneling layer. The semiconductor channel 156 includes a polysilicon layer in some aspects. Optionally, the semiconductor channel 156 may include an amorphous silicon layer. Like the extended opening 124, the semiconductor channel 156 also passes through the dielectric stacks 140 and 143 and layers 133-135, and partially passes through the layer 132. The blocking layer, charge trap layer, tunneling layer, and semiconductor channel 156 may be deposited by, e.g., CVD and/or ALD.

After the semiconductor channel 156 is formed, the opening of the channel hole is filled by an oxide material 157. In some cases, the functional layer 155 includes an oxide-nitride-oxide (ONO) structure. That is, the blocking layer is a silicon oxide layer, the charge trap layer is a silicon nitride layer, and the tunneling layer is another silicon oxide layer. Optionally, the functional layer 155 may have a structure different from the ONO configuration. In the following descriptions, the ONO structure is used exemplarily.

The structure formed in a channel hole, including the functional layer 155 and semiconductor channel 156, is referred to as the channel hole structure. The channel hole structure 153 is used for making memory cells, while the channel hole structures 151, 152, and 154 are dummy ones. The dummy channel hole structures 151-152 have the functional layer 155 and semiconductor channel 156 that extend through the dielectric stack 143. Further, the dummy channel hole structures 151-152 include the dielectric filling structure 123 that extends through the dielectric stack 140. As illustrated above, the dielectric filling structure 123 is formed by filling a channel hole with one or more dielectric materials. The filling structure 123 does not have a specific structure in some cases.

In some embodiments, processes may be performed to make certain structures for the SCTs after the dielectric stack 143 is made. The SCTs are respectively made in the SCT regions 94A of FIG. 1A. These processes may be done before or after the channel hole structures are fabricated. The SCTs will be used to electrically contact the word lines, respectively. For example, a structure for SCT may be constructed by forming an opening that exposes a sacrificial stack layer (e.g., a layer 142 or 142A), etching a portion of the exposed sacrificial stack layer to create a cavity, and filling the opening and cavity by an SCT filling structure. At a later time, the SCT filling structure will be etched out to expose a conductive layer and conductive materials will be deposited to make the SCT.

Figure 9:
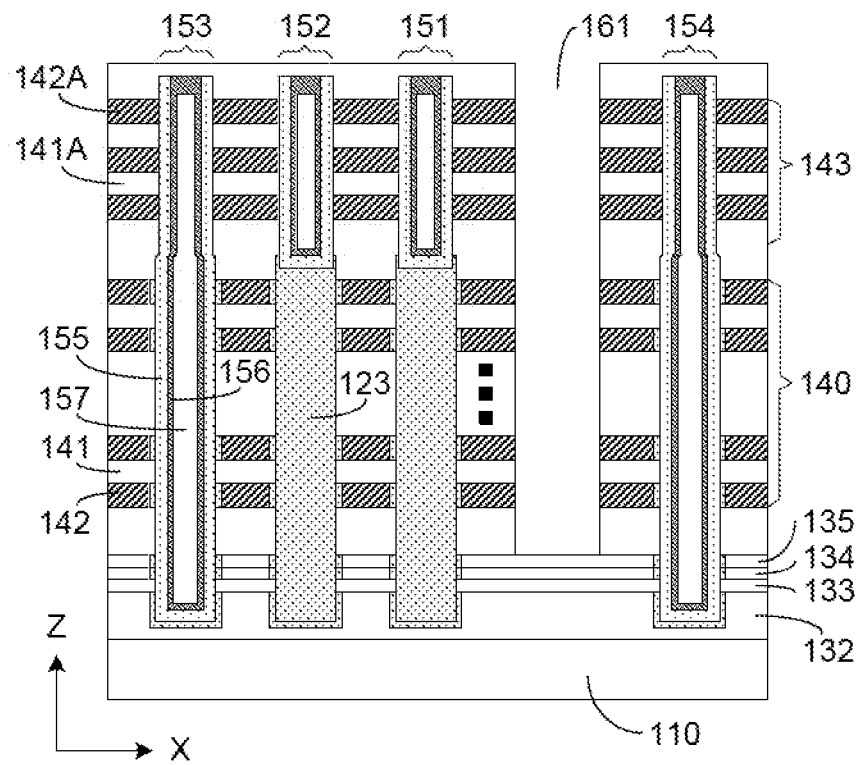
FIG. 9 illustrates a cross-sectional view of the 3D array device shown in FIG. 8 after a GLS is formed according to various aspects of the present disclosure.

FIG. 9 shows a schematic cross-sectional view of the structure shown in FIG. 8 after a GLS 161 is etched according to aspects of the present disclosure. The etch may be, for example, a dry etch process or a combination of dry and wet etch processes. Before the etch, a dielectric material (e.g., silicon oxide) is deposited to cover the channel hole structures, and then a flattening process such as CMP is done. The GLS 161 corresponds to the GLS structure 92A of FIG. 1A. When the GLS 161 is made, other openings (not shown) for GLS are formed concurrently. These openings correspond to the GLS structure 91A and 93A of FIG. 1A, respectively. As shown in FIG. 9, the GLS 161 extends through the dielectric stacks 140 and 143, and reaches the layer 135 in the Z direction or in a direction approximately perpendicular to the substrate 110. On the sidewall of the GLS 161, the dielectric layers 141-142 and 141A-142A are exposed.

Figure 10:
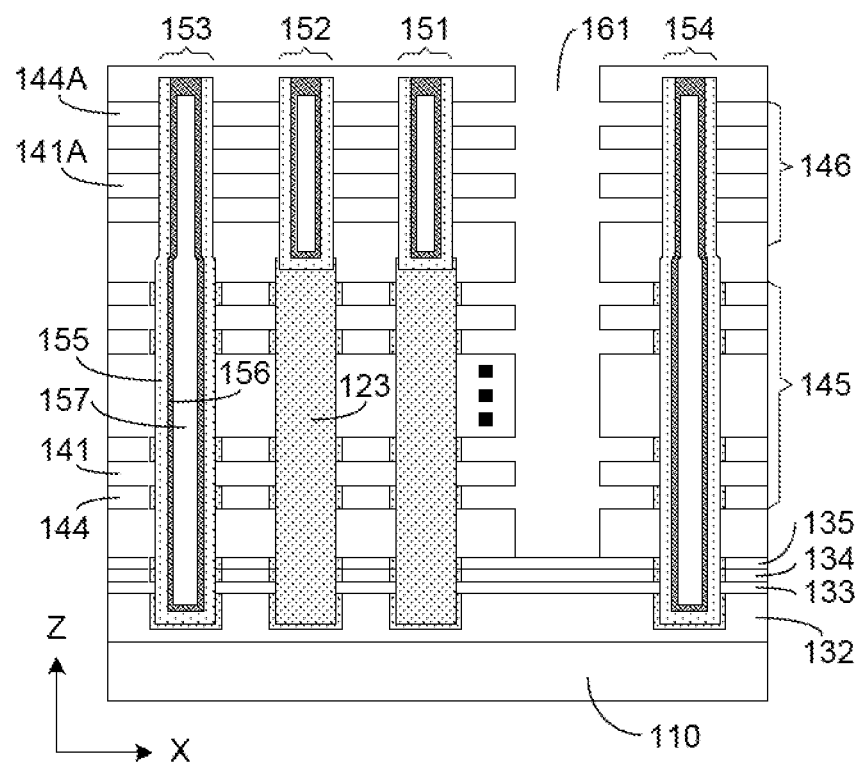
FIGS. 10, 11, and 12 illustrate cross-sectional views of the 3D array device shown in FIG. 9 at certain stages in the fabrication process according to various aspects of the present disclosure.

Further, a selective etch process, e.g., a selective wet etch process is performed to remove the dielectric layers 142 and 142A, leaving cavities 144 between the dielectric layers 141 and cavities 144A between the dielectric layers 141A, as shown in FIG. 10. The dielectric stacks 140 and 143 are changed into dielectric stacks 145 and 146, respectively.

Figure 11:
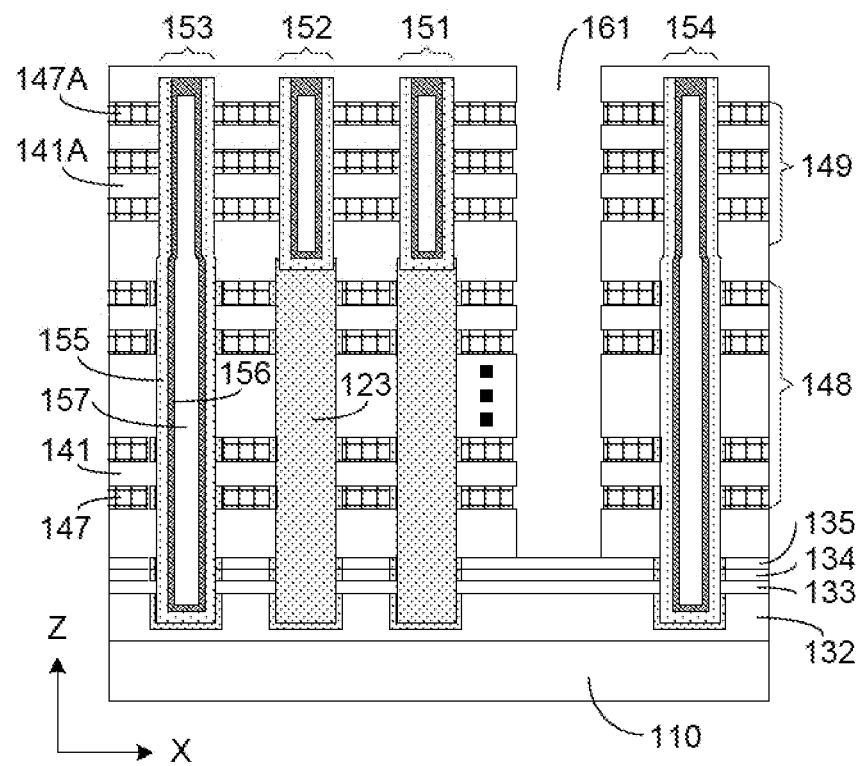

After the cavities 144 and 144A are formed, a conductive material such as tungsten (W) is grown to fill the cavities, forming conductive layers 147 between the dielectric layers 141 and conductive layers 147A between the dielectric layers 141A. After the conductive layers 147 and 147A are made, the dielectric stacks 145 and 146 are converted into conductor/insulator stack 148 and 149, respectively, as shown in FIG. 11. The stacks 148 and 149 may be considered as decks or conductor/insulator stack structures that contain the channel hole structures, and have dielectric layers and conductive layers that are alternatingly stacked over each other. The dummy channel hole structures 151-152 and 154 each extend through the conductor/insulator stacks 148 and 149. The dummy channel hole structures 151-152 have filling structures 123 that extend through the conductor/insulator stack 148, and functional layers 155 and semiconductor channels 156 that extend through the conductor/insulator stack 149.

In some aspects, before metal W is deposited in the cavities, a dielectric layer (not shown) of a high-k dielectric material such as aluminum oxide may be deposited. Thereafter, a layer of a conductive material such as titanium nitride (TiN) (not shown) is deposited. Further, metal W is deposited to form the conductive layers 147 and 147A. CVD and/or ALD may be used in the deposition processes. Alternatively, another conductive material, such as molybdenum (Mo), ruthenium (Ru), cobalt (Co), copper (Cu), aluminum (Al), titanium (Ti), tantalum (Ta), tantalum nitride (TaN), doped silicon, or any combination thereof, may be used to form the conductive layers.

Referring to FIG. 11, a portion of each functional layer 155 in a channel hole structure is between a portion of one of the conductive layers 147 and 147A and a portion of a semiconductor channel 156 in the channel hole structure. Each conductive layer 147 or 147A is configured to connect rows of NAND memory cells in an X-Y plane and is configured as a word line. The semiconductor channel 156 formed in the channel hole structure is configured to connect a column or a string of NAND memory cells along the Z direction and configured as a bit line. As such, a portion of the functional layer 155 in the channel hole structure in an X-Y plane, as a part of a NAND memory cell, is arranged between a conductive layer and a semiconductor channel, i.e., between a word line and a bit line. The functional layer 155 may also be considered as disposed between the semiconductor channel and the conductor/insulator stack 148 or 149. A portion of the conductive layer 147 or 147A that is around a portion of the channel hole structure functions as a control gate or gate electrode for a NAND memory cell. A 3D array device can be considered as including a 2D array of strings of NAND cells (such a string is also referred to as a "NAND string") in the stacks 148 and 149. Each NAND string contains multiple NAND memory cells and extends vertically toward the substrate 110. The NAND strings form a 3D array of the NAND memory cells through the conductor/insulator stacks over the substrate 110.

Figure 12:
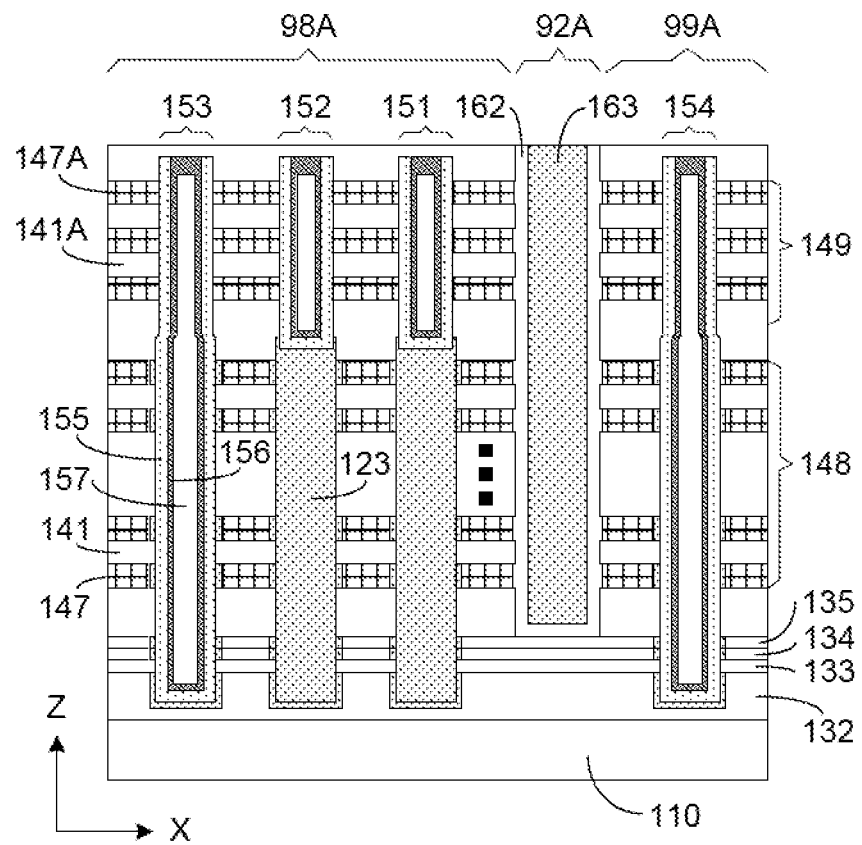

After the conductive layers 147 and 147A are formed in the cavities, one or more dielectric material may be deposited to fill the GLS 161 by CVD and/or ALD. In some cases, a dielectric layer 162 (e.g., a silicon oxide layer) is grown on the sidewall and bottom surface of the GLS 161, and then another material 163 (e.g., silicon nitride) is deposited. Optionally, the GLS 161 may be filled by depositing one or more dielectric layers first and then a semiconductor material such as polysilicon. The filled GLS 161 becomes the GLS structure 92A, which is shown in FIG. 12. When the GLS structure 92A is fabricated, the GLS structures 91A and 93A are fabricated concurrently. The structure of FIG. 12 may be considered as the 3D array structure 100A.

Further, the SCT filling structure (not shown) is removed in a selective etch (e.g., a selective wet etch), and an opening and a cavity are created. A conductive layer 147 or 147A is exposed in the cavity. A conductive material such as W is deposited in the opening and cavity to make an SCT in the opening that connects to the exposed conductive layer, i.e., a word line. The SCT may be used as a contact of the word line.

As aforementioned, the structures 151-154 are arranged along the line AA' of FIG. 1A. The structures 151-153 are in the section 98A that is a part of a memory cell region and the memory finger 96A. The dummy channel hole structure 154 is outside the memory cell region, adjacent to the GLS structure 92A, and separated from the structures 151-153 by the GLS structure 92A. In some aspects, the dummy channel hole structure 154 is arranged for mechanical support of the stacks, while the dummy channel hole structures 151-152 are arranged for improving the yield and reliability.

Due to the stress created when the channel hole structures and the GLS structures are made, the GLS structure 92A may tilt in some cases. For example, the top part of the GLS structure 92A may move long the X direction (i.e., moving away from the memory block 95A or memory finger 96A), while the bottom part of the GLS structure 92A may move against the X direction (i.e., moving toward the memory block 95A or memory finger 96A). As such, the bottom part of the GLS structure 92A may press a channel hole structure that is adjacent to it, such as the dummy channel hole structure 151. If the filling structure 123 is not in the channel hole, and a functional layer is deposited there, the functional layer may change under pressure. In certain circumstances, it may cause electrical leakage between adjacent conductive layers 147.

Hence, the dielectric filling structure 123 may be used to improve the yield and reliability by reducing the leakage risk. In some aspects, when pressed by the GLS structure 92A, the bottom part of the dummy channel hole structure 151 may press the bottom part of the dummy channel hole structure 152, causing similar issues. As such, the dummy channel hole structure 152 may optionally have the dielectric filling structure 123 to avoid the leakage risk. Further, the structure 153 may have the dielectric filling structure 123 for the same reasons in certain cases. When the structure 153 has the filling structure 123 that extends through the stack 148, it becomes a dummy channel hole structure. In certain cases, the dummy channel hole structure 154 may also have the dielectric filling structure 123 at the bottom to enhance the yield and reliability.

Referring to FIG. 1A, due to the stress created when the channel hole structures and GLS structures are made, the GLS structure 93A may also tilt in some cases. The top part of the GLS structure 92A may move against the X direction (i.e., moving away from the memory block 95A), while the bottom part of the GLS structure 93A may move along the X direction (i.e., moving toward the memory block 95A). As such, structures and fabrication methods illustrated above may be used for channel hole structures proximate to the GLS structure 93A for the same reasons. For example, a channel hole structure adjacent to the GLS structure 93A and in the memory block 95A may be a dummy and have a dielectric filling structure 123 through the stack 148.

Figure 13:
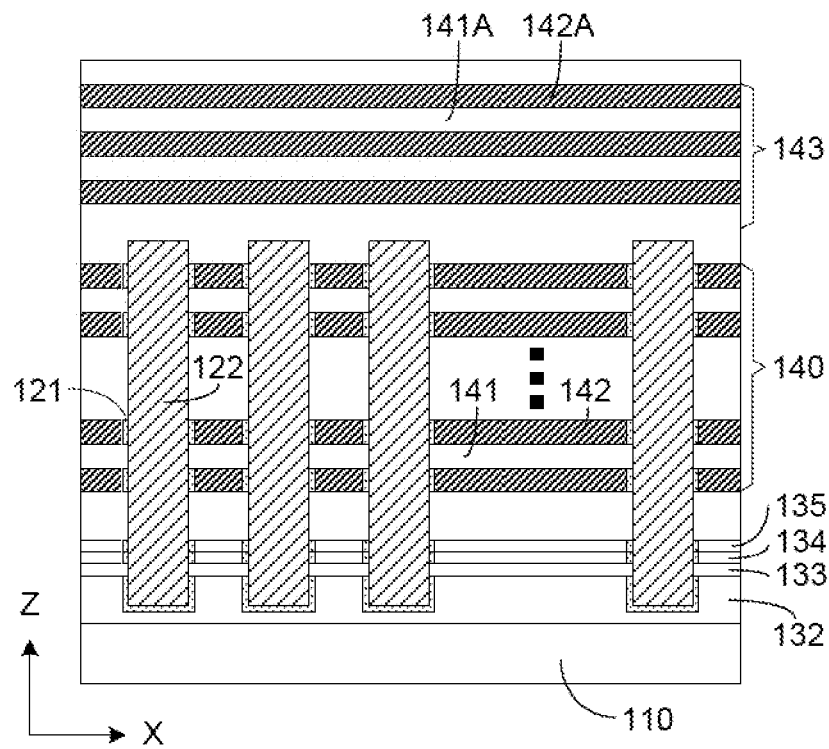
FIGS. 13 and 14 illustrate cross-sectional views of the 3D array device shown in FIG. 4 at certain stages in another fabrication process according to various aspects of the present disclosure.

With reference to FIG. 4, after the filling structures 122 are made in the openings 120, an alternative fabrication process may be carried out in some other cases. FIG. 13 shows a schematic cross-sectional view of the structure shown in FIG. 4 after a dielectric stack 143 is formed over the filling structures 122 according to aspects of the present disclosure. The dielectric stack 143 of FIG. 13 may be the same as or similar to the dielectric stack 143 of FIG. 6. The dielectric stack 143 of FIG. 13 is made over and aligned to the stack 140 along the Z direction after a flattening process. The dielectric stack 143 of FIG. 13 may contain multiple pairs of stack layers, such as third dielectric layers 141A and fourth dielectric layers 142A that are stacked alternately over each other. Optionally, the third dielectric layer 141A includes a silicon oxide layer, which may be used as an isolation stack layer, while the fourth dielectric layer 142A includes a silicon nitride layer, which may be used as a sacrificial stack layer. CVD and/or ALD may be used in the deposition process.

Figure 14:
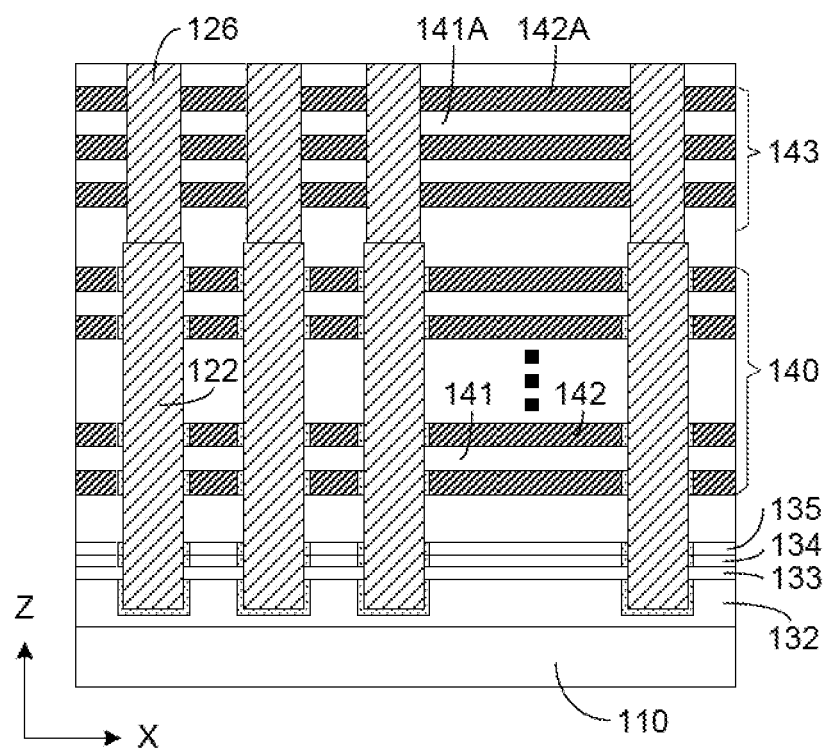
Figure 15:
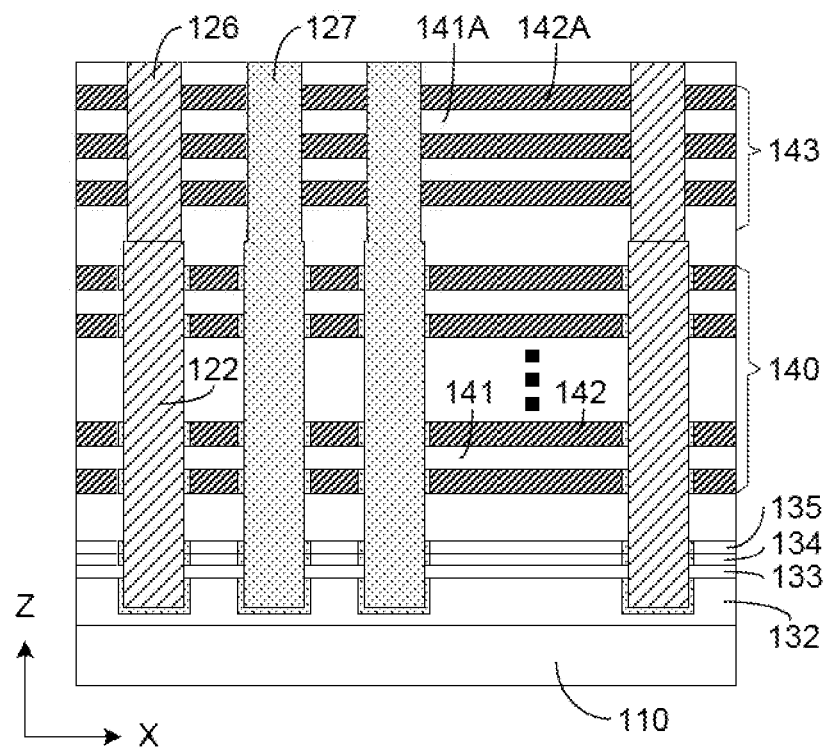
FIGS. 15-18 illustrate cross-sectional views of the 3D array device shown in FIG. 14 at certain stages in the other fabrication process according to various aspects of the present disclosure.

Further, openings (not shown) are etched and then filled with one more materials (e.g., polysilicon). The openings are aligned to the filling structures 122 along the Z direction. Thus, filling structures 126 are aligned to the filling structures 122 as well, as shown in FIG. 14. The filling structures 126 and 122 in the middle are removed in a selective etch, e.g., a selective wet etch, creating channel holes through the stacks 140 and 143. The channel holes are filled with one or more dielectric materials (e.g., silicon oxide) by CVD and/or ALD. FIG. 15 shows dielectric filling structures 127 formed by the filling process schematically. The filling structures 127 are made to fill the channel holes with one or more dielectric materials (e.g., silicon oxide), extend through the dielectric stacks 140 and 143 and layers 133-135, and are used as dummy channel hole structures. Further, the remaining filling structures 126 and 122 are removed in a selective etch, and openings left by the selective etch are channel holes (not shown) through the dielectric stacks 140 and 143. Channel hole structures are formed in the channel holes.

Figure 16:
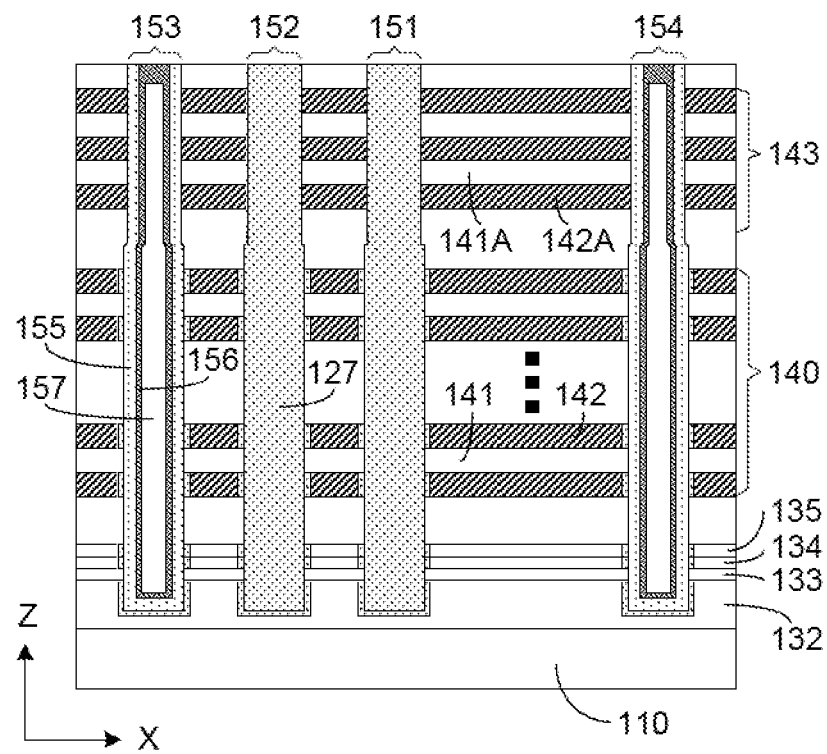

FIG. 16 shows a schematic cross-sectional view of the structure shown in FIG. 15 after channel hole structures 151-154 are made according to aspects of the present disclosure. The channel hole structures 151, 152, and 154 are dummy ones optionally. The dummy channel hole structures 151 and 152 each contain a filling structure 127. The channel hole structure 153 may be the same as or similar to the structure 153 of FIG. 8. A functional layer 155 is deposited on the sidewall and bottom of the channel hole. The functional layer 155 includes a blocking layer, a charge trap layer, and a tunneling layer. A semiconductor channel 156 is deposited on the functional layer. The semiconductor channel 156 includes a polysilicon layer in some cases. The opening of the channel hole is filled by an oxide material 157. The functional layer has the ONO configuration exemplarily. The dielectric filling structure 127, formed by filling a channel hole with one or more dielectric materials, does not have a specific structure in some cases.

Figure 17:
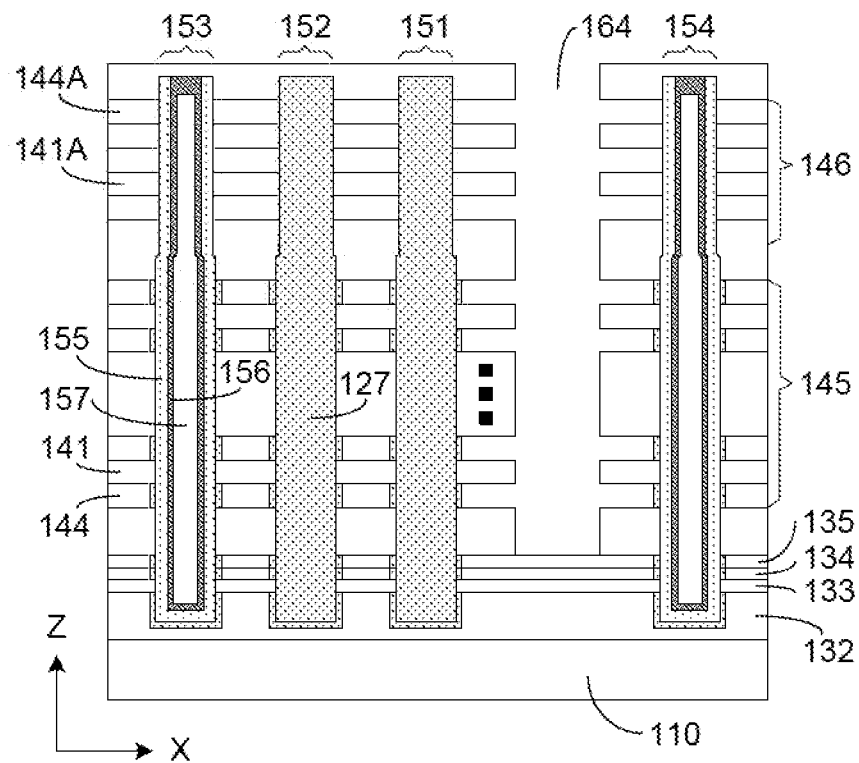

Further, a dielectric material (e.g., silicon oxide) is deposited to cover the structures 151-154, followed by a flattening process. An etch process is performed to form a GLS 164 that corresponds to the GLS structure 92A of FIG. 1A. The GLS 164 extends through the dielectric stacks 140 and 143, and reaches the layer 135 in the Z direction. On the sidewall of the GLS 164, the dielectric layers 142 and 142A are exposed and then removed in a selective etch, creating cavities 144 and 144A as shown in FIG. 17. The dielectric stacks 140 and 143 are converted into dielectric stacks 145 and 146, respectively.

The cavities 144 and 144A are filled with W to create conductive layers 147 and 147A, and conductor/insulator stacks 148 and 149 are formed. Optionally, before metal W is deposited in the cavities, a high-k dielectric material may be deposited. Then, a layer of a conductive material such as TiN (not shown) is deposited, and metal W is deposited to form the conductive layers 147 and 147A.

Figure 18:
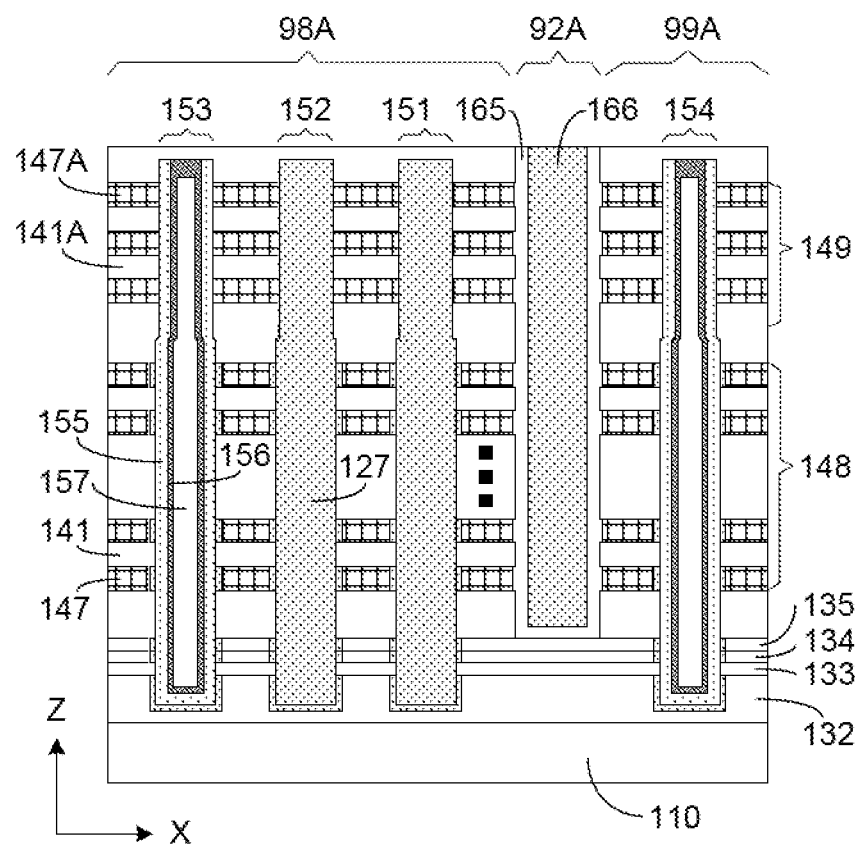

Further, one or more dielectric materials may be deposited to fill the GLS 164. For example, a dielectric layer 165 (e.g., a silicon oxide layer) and a dielectric material 166 (e.g., silicon nitride) may be deposited. The filled GLS 164 becomes the GLS structure 92A, as shown in FIG. 18. The structure of FIG. 18 may be considered as the 3D array structure 100B.

Referring to FIGS. 1A and 18, the structures 151-153 are in a region of a memory cells, while the structure 154 is outside the memory region and separated from the structures 151-153 by the GLS 92A. The dummy channel hole structure 154 is arranged for mechanical support of the stacks. The dummy channel hole structures 151-152 have the dielectric filling structures 127 through the stacks 148 and 148, and are arranged to improve the yield and reliability for reasons depicted above.

The dummy hole structure 151 is adjacent or closest to the GLS structure 92A among the structures 151-153. In some aspects, only the structure 151 has the dielectric filling structure 127. Alternatively, besides that the structure 151 has the dielectric filling structure 127, the structures 152, 153, and/or 154 may also have the structure 127 to enhance the yield and reliability.

Figure 19:
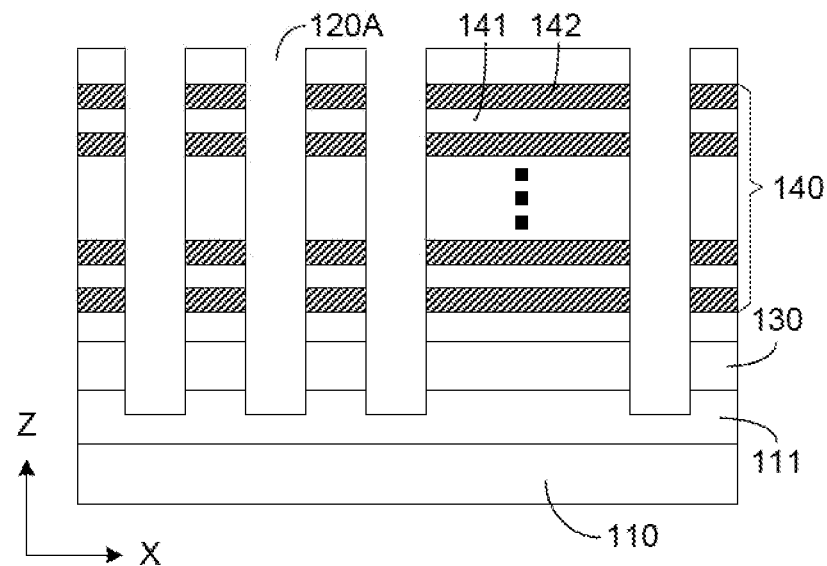
FIGS. 19 and 20 illustrate cross-sectional views of the 3D array device shown in FIG. 2A at certain stages in another fabrication process according to various aspects of the present disclosure.

FIGS. 19-25 show schematic cross-sectional views of the structure shown in FIG. 2A at certain stages in an alternative fabrication process according to aspects of the present disclosure. Referring to FIG. 2A, the dielectric stack 140 is deposited over the layer 130. Thereafter, openings 120A are formed by a dry etch process or a combination of dry and wet etch processes, as shown in FIG. 19. The openings 120A are channel holes in the dielectric stack 140. Positions of the openings 120A correspond to that of the channel hole structures 151-154 of FIG. 1A. Optionally, the opening 120A passes through the dielectric stack 140 and layer 130, and partially penetrates the layer 111. The first and second dielectric layers 141 and 142, and layers 111 and 130 are exposed on the sidewall and bottom of the opening 120A.

Figure 20:
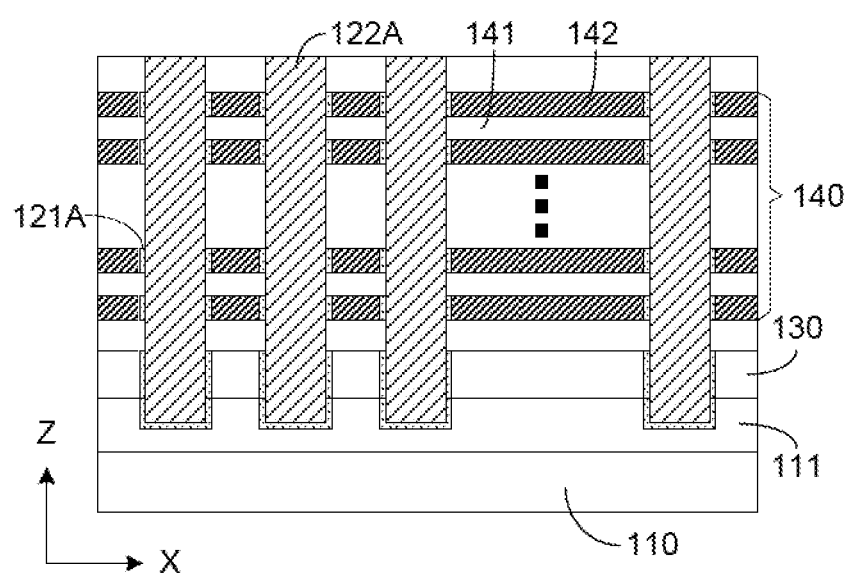

In certain embodiments, the second dielectric layer 142 is silicon nitride, the layer 130 is polysilicon, and the layer 111 is crystalline silicon. When an oxidation process is performed optionally, exposed portions of these layers are changed into silicon oxide. For example, exposed parts of the second dielectric layers 142 become silicon oxide regions 121A. In some other embodiments, the oxidation process is not performed. Further, CVD and/or ALD is performed to fill the opening 120A with a material such as polysilicon or carbon. Filling structures 122A are formed in the openings 120A, as shown in FIG. 20.

Further, a dielectric stack 143 is deposited over the filling structures 122A and the dielectric stack 140. This dielectric stack 143 may be the same as or similar to the dielectric stack 143 of FIG. 6, aligned to the stack 140 along the Z direction, and have third dielectric layers 141A and fourth dielectric layers 142A stacked alternately over each other. Optionally, the third dielectric layer 141A is silicon oxide and used as an isolation stack layer, while the fourth dielectric layer 142A is silicon nitride layer and used as a sacrificial stack layer.

Figure 21:
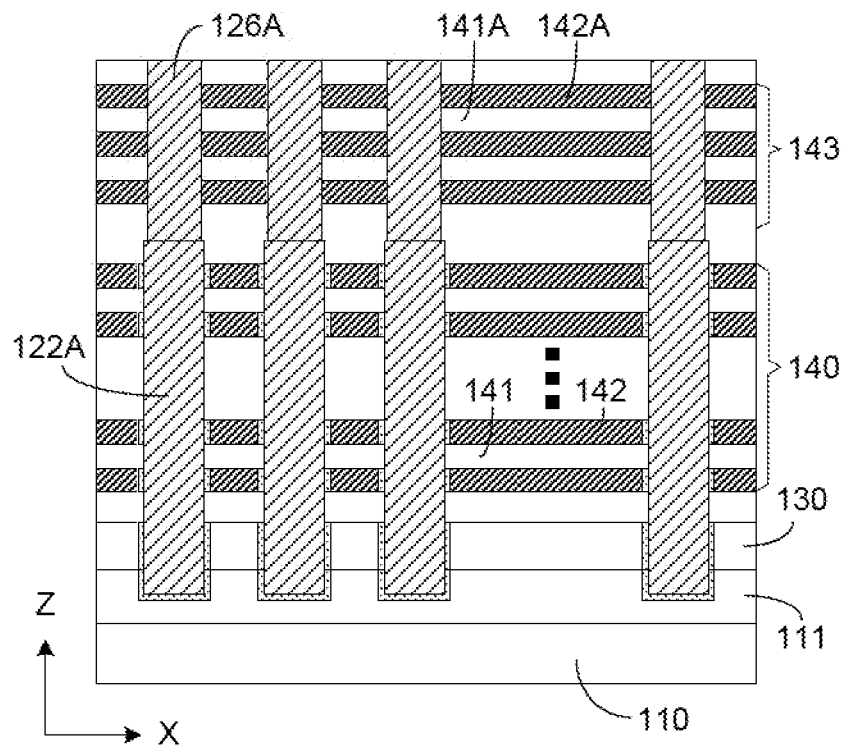
FIGS. 21-24 illustrate cross-sectional views of the 3D array device shown in FIG. 20 at certain stages in the other fabrication process according to various aspects of the present disclosure.
Figure 22:
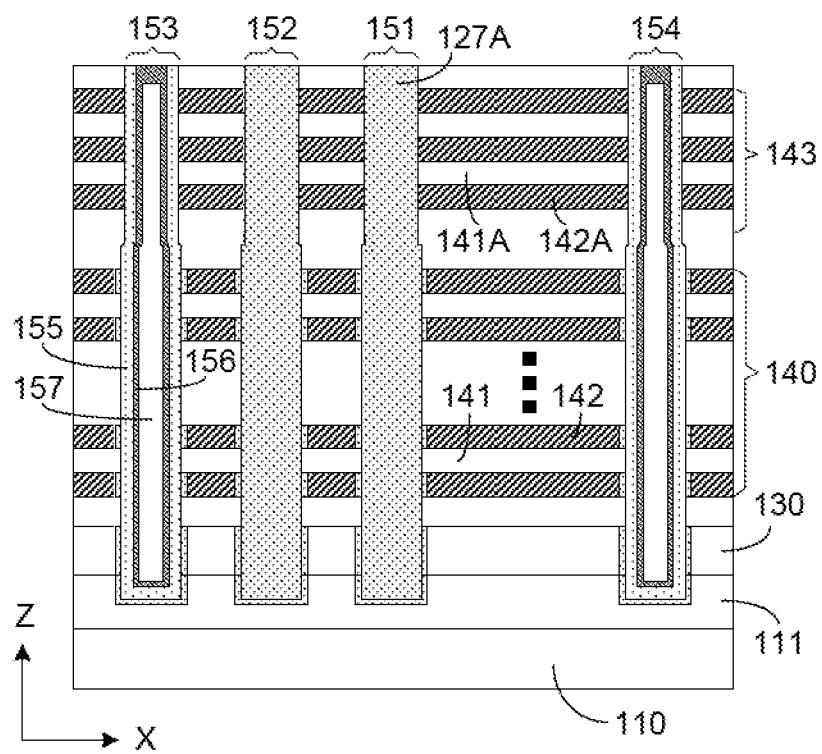

Further, openings (not shown) are etched to expose the filling structures 122A and then filled with one more materials (e.g., polysilicon or carbon). Filling structures 126A are made and aligned with the filling structures 122A along the Z direction, as shown in FIG. 21. The filling structures 126A and 122A in the middle are removed in a selective etch, e.g., a selective wet etch, and channel holes through the stacks 140 and 143 are formed. The channel holes are filled with one or more dielectric materials (e.g., silicon oxide) by a deposition process. FIG. 22 shows dielectric filling structures 127A formed by the deposition. The filling structures 127A extend through the dielectric stacks 140 and 143 and layer 130, and are used as dummy channel hole structures. Further, the remaining filling structures 126A and 122A are removed in a selective etch. Openings left by the selective etch are channel holes (not shown) that pass through the stacks 140 and 143. Channel hole structures are formed in the channel holes. The channel hole structures 151, 152, and 154 are dummy ones in some cases.

The channel hole structure 153 may be the same as or similar to the structure 153 of FIG. 8. A functional layer 155 is deposited on the sidewall and bottom of the channel hole. The functional layer 155 includes a blocking layer, a charge trap layer, and a tunneling layer that are deposited sequentially. A semiconductor channel 156 is deposited on the tunneling layer. The semiconductor channel 156 includes a polysilicon layer in some cases. The opening of the channel hole is filled by an oxide material 157. The functional layer 155 has the ONO configuration exemplarily.

Further, a dielectric material (e.g., silicon oxide) is deposited to cover the structures 151-154, and a flattening process is performed. A GLS 164A is etched at the position of the GLS structure 92A. The GLS 164A extends through the dielectric stacks 140 and 143 in the Z direction, and exposes the sacrificial layer 130 at the bottom.

Thereafter, spacer layers (not shown) are deposited on the sidewall and bottom of the GLS 164A to protect the dielectric layers 141-142 and 141A-142A. The spacer layers may include, for example, silicon oxide and silicon nitride. Parts of the spacer layers at the bottom are removed by etch to expose the sacrificial layer 130 again. Subsequently, one or more selective etch processes are performed to remove the sacrificial layer 130 and certain bottom portions of the functional layer 155. A cavity is formed and bottom portions of the semiconductor channel 156 are exposed. The cavity is filled by a semiconductor material, e.g., polysilicon, to form a semiconductor layer 136, e.g., by CVD and/or ALD. The semiconductor layer 136 is n-doped, formed on and contacting the semiconductor channel 155.

Figure 23:
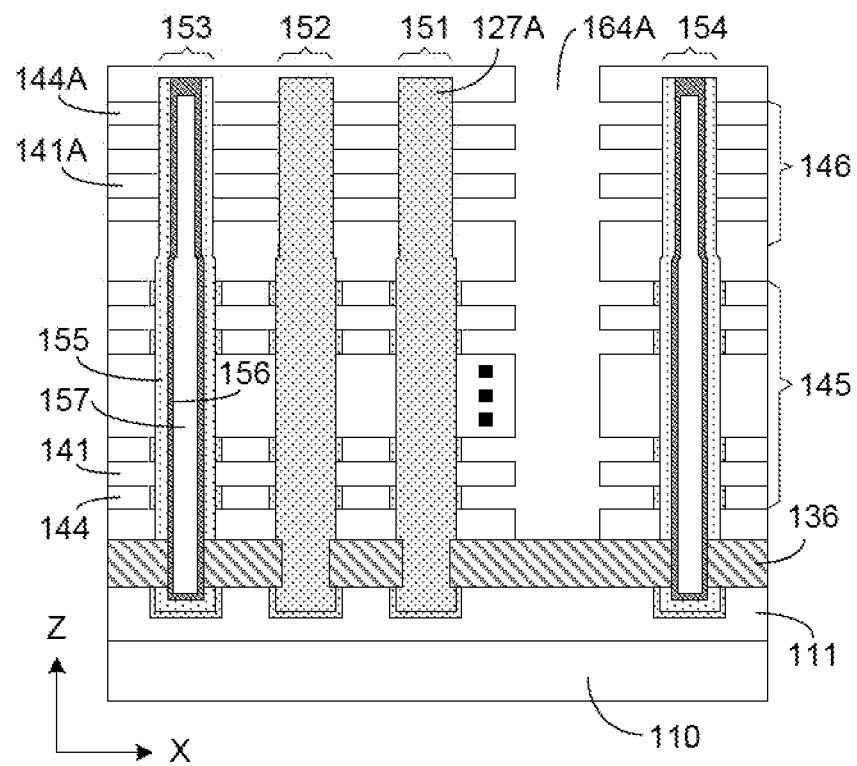

After the semiconductor layer 136 is formed, the spacer layers are removed in a selective etch process, which exposes the sides of the dielectric layers 142 and 142A. The dielectric layers 142 and 142A are removed in a selective etch, creating cavities 144 and 144A as shown in FIG. 23. The dielectric stacks 140 and 143 are converted into dielectric stacks 145 and 146, respectively.

Figure 24:
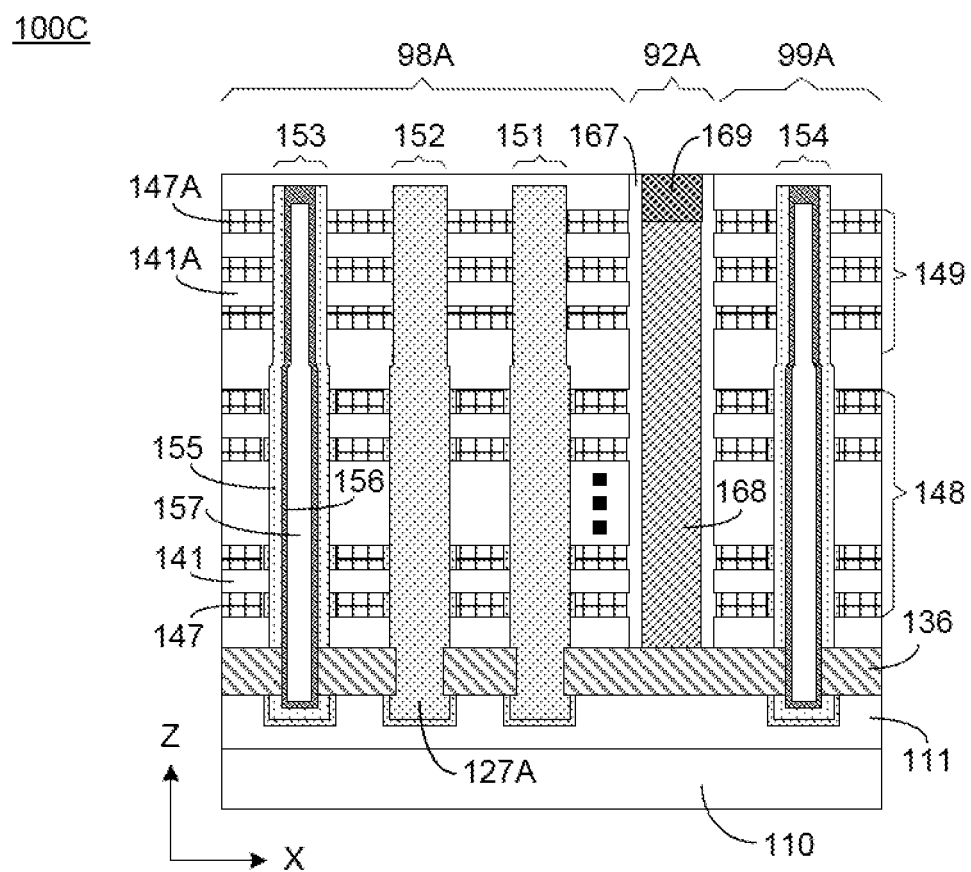

The cavities 144 and 144A may be filled with W to create conductive layers 147 and 147A, and conductor/insulator stack 148 and 149 are formed. Thereafter, a dielectric layer 167 (e.g., a silicon oxide layer) is deposited on the sidewall and bottom of the GLS 164A by CVD and/or ALD. The dielectric layer at the bottom is etched to expose the semiconductor layer 136. The GLS 164A is filled with a conductive material (e.g., doped polysilicon) and a conductive plug 169 (e.g., metal W). The conductive material forms a conductive structure 168 that extends through the conductor/insulator stacks 148 and 149 and electrically contacts the semiconductor layer 136, as shown in FIG. 24. After the GLS 164A is filled, it becomes the GLS structure 92A. In certain aspects, the filled GLS 164A is used as an array common source. The structure as shown in FIG. 24 may be considered as the 3D array structure 100C.

Optionally, the GLS 164A may be filled with dielectric materials (e.g., silicon oxide or silicon nitride). The substrate layer 110 and layer 111 may be removed to expose the semiconductor layer 136 at a certain stage. Further, a conductive material such as doped polysilicon may be deposited to form a layer that electrically contacts the semiconductor layer 136 and functions as the array common source.

Referring to FIG. 1A, the structures 151-153 are in a region of memory cells, while the structure 154 is outside the memory region, adjacent to the GLS structure 92A, and separated from the structures 151-153 by the GLS structure 92A. The dummy channel hole structure 154 is arranged for mechanical support of the stacks. The dummy channel hole structures 151-152 have the dielectric filling structures 127A, and are arranged to improve the yield and reliability for reasons depicted above.

The dummy hole structure 151 is adjacent or closest to the GLS structure 92A among the structures 151-153. In some aspects, only the structure 151 has the dielectric filling structure 127A. Alternatively, besides the structure 151, the structure 152, 153, and/or 154 may also have the dielectric filling structure 127A to enhance the yield and reliability.

In certain other cases, the dielectric filling structure 127A may be made only through the conductor/insulator stack 148 with the same or similar benefits. For example, such a dielectric filling structure may be fabricated by combining the methods used for the structure 100C and structure 100A of FIG. 12.

Figure 25:
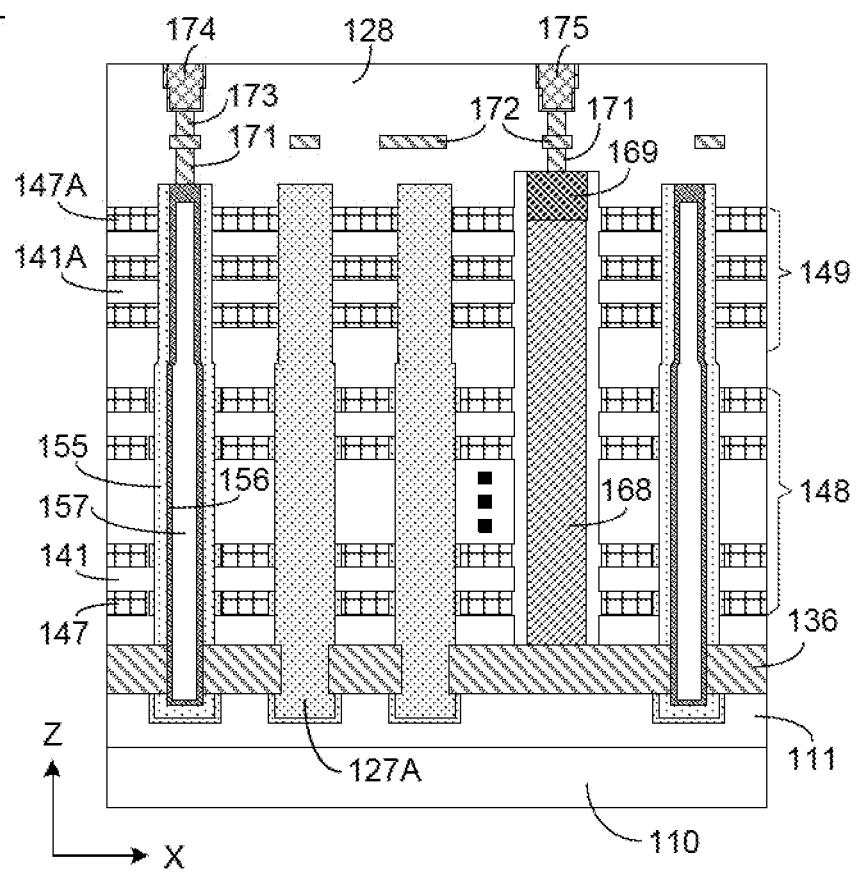
FIG. 25 illustrates a cross-sectional view of the 3D array device shown in FIG. 24 at a certain stage in the other fabrication process according to various aspects of the present disclosure.

After the structures 100A, 100B, and 100C are formed, additional processes may be performed. Take the structure 100C for example. A dielectric layer 128 is deposited over the conductor/insulator stack 149. Openings are etched and then filled with a conductive material such as W, Co, Cu, Al to make vias 171. The vias 171 are aligned with and contact the upper end of the channel hole structure 153 and the plug 169, respectively. Further, conductor layers (such as metal lines) 172 are deposited for interconnect, and then vias 173 and connecting pads 174 and 175 are made, as shown in FIG. 25. Conductive materials (e.g., W, Co, Cu, Al, or a combination thereof) and CVD and/or ALD may be used in the deposition processes. Optionally, a contact/barrier layer (e.g., TiN) may be deposited first before depositing the conductive material. The 3D array structure shown in FIG. 25 may be referred to as a 3D array device 100C1.

Figure 26:
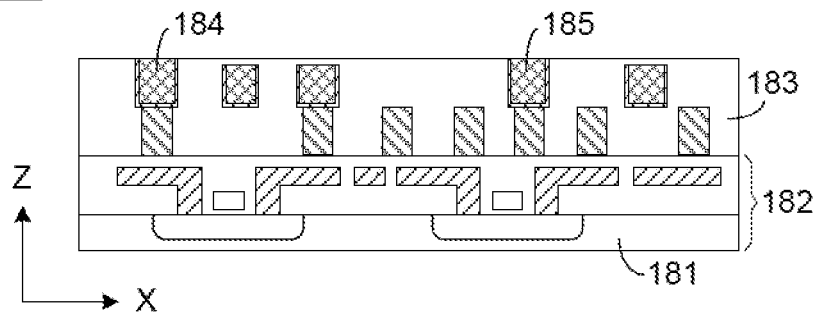
FIG. 26 illustrates a cross-sectional view of an exemplary periphery device according to various aspects of the present disclosure.

FIG. 26 shows a schematic cross-sectional view of a periphery device 180A according to aspects of the present disclosure. The periphery device 180A is a part of a 3D memory device and may also be referred to as a peripheral structure. The periphery device 180A includes a substrate 181 that may include single crystalline silicon, Ge, SiGe, SiC, SOI, GOI, polysilicon, or a Group III-V compound such as GaAs or InP. Periphery CMOS circuits 182 (e.g., control circuits) are fabricated on the substrate 181 and used for facilitating the operation of the 3D memory device. For example, the periphery CMOS circuits 182 may include metal-oxide-semiconductor field-effect transistors (MOSFETs) and provide functional devices such as page buffers, sense amplifiers, column decoders, and row decoders. A dielectric layer 183 is deposited over the substrate 181 and the CMOS circuits 182. Connecting pads (such as connecting pads 184 and 185) and vias are formed in the dielectric layer 183. The dielectric layer 183 includes one or more dielectric materials such as silicon oxide and silicon nitride. The connecting pads 184-185 are formed to connect with the 3D array device 100C1 and may include a conductive material such as W, Co, Cu, Al, Ti or a combination thereof.

For the 3D array device 100C1 and periphery device 180A, the bottom side of the substrate 110 or 181 may be referred to as the back side, and the side with the connecting pads 174-175 or 184-185 may be referred to as the front side or face side.

Figure 27:
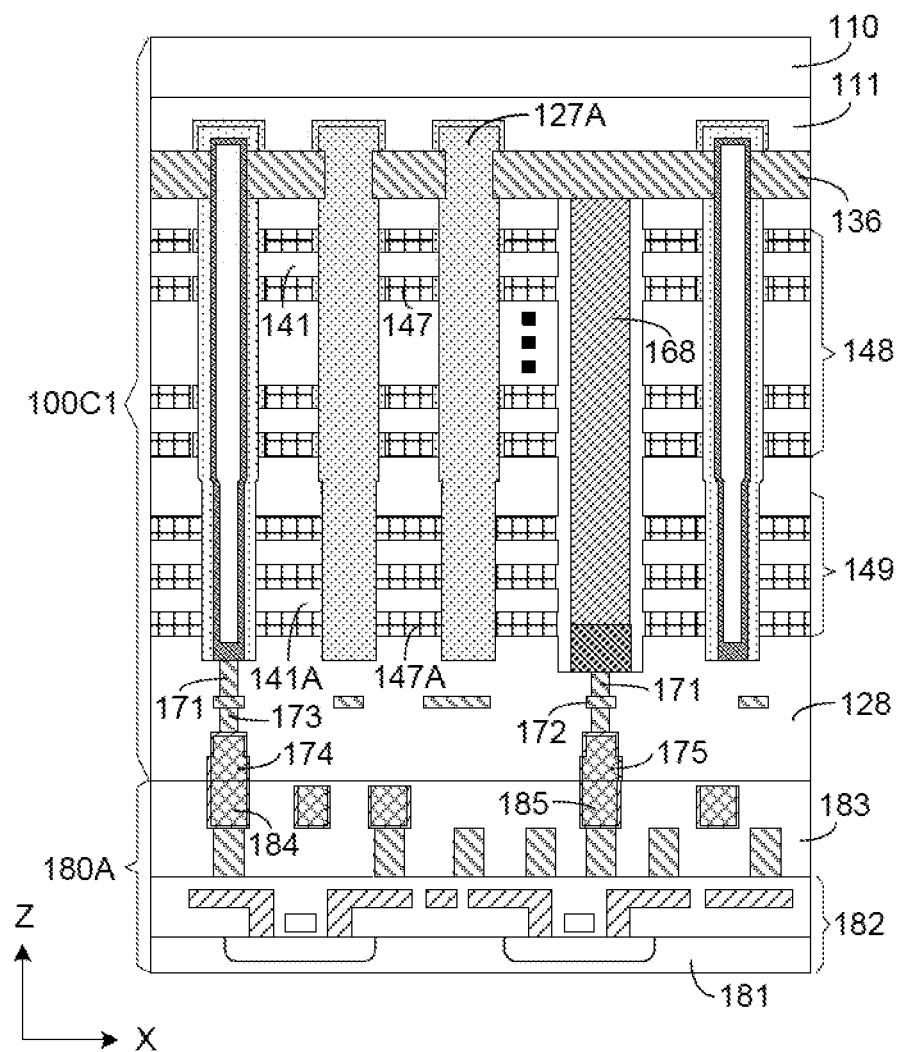
FIG. 27 illustrates a cross-sectional view of a 3D memory device after the 3D array device shown in FIG. 25 is bonded with the periphery device shown in FIG. 26 according to various aspects of the present disclosure.

FIG. 27 schematically shows a fabrication process of an exemplary 3D memory device 190 in a cross-sectional view according to aspects of the present disclosure. The 3D memory device 190 includes the 3D array device 100C1 shown in FIG. 25 and the periphery device 180A shown in FIG. 26. In some embodiments, the 3D array device 100C1 and the periphery device 180A are fabricated separately and then bonded together to form the 3D memory device 190.

Provided the 3D array device 100C1 and periphery device 180A are bonded by a flip-chip bonding method to form the 3D memory device 190, as shown in FIG. 27. In some aspects, the 3D array device 100C1 is flipped vertically and becomes upside down with the top surfaces of the connecting pads 174-175 facing downward. The two devices are placed together such that the 3D array device 100C1 is above the periphery device 180A. After an alignment is made, e.g., the connecting pads 174-175 are aligned with the connecting pads 184-185, respectively, the 3D array device 100C1 and periphery device 180A are joined face to face and bonded together. In some aspects, a solder or a conductive adhesive is used for the bonding process.

Thereafter, other fabrication steps or processes are performed to complete fabrication of the 3D memory device 190. The other fabrication steps and processes are not reflected in FIG. 27 for simplicity. For example, from the bottom surface (after the flip-chip bonding), the substrate 110 of the 3D array device 100C1 is thinned by a thinning process, such as wafer grinding, dry etch, wet etch, CMP, or a combination thereof. A dielectric layer is grown over the doped region 111 by a deposition process. Vias and conductor layers are formed. Further, a passivation layer is deposited and contact pads are formed. Details of additional fabrication steps or processes are omitted for simplicity.

The 3D memory device 190 is based on the structure 100C of FIG. 24. In some other embodiments, a 3D memory device may be fabricated based on the structure 100A of FIG. 12 or structure 100B of FIG. 18. In these cases, after a flip-chip bonding step, the substrate 110 of the structure 100A (or 100B) may be removed from the bottom by a thinning process, such as wafer grinding, wet etch, CMP, or a combination thereof. Optionally, the layers 132-135 are polysilicon, silicon oxide, silicon nitride, and polysilicon, respectively. The layer 132 is exposed and etched. After the layer 132 is removed, the layer 133 and the blocking layer of the functional layer 155 become exposed. The layers 133-134, the exposed blocking layer, charge trap layer, and tunneling layer are etched out by certain selective etches. The layer 135 and semiconductor channel 156 are exposed. A semiconductor material (e.g., doped polysilicon) may be deposited to form a semiconductor layer over the layer 135 and semiconductor channels 156. The semiconductor layer electrically contacts the semiconductor channels 156 and may function as an array common source in some cases. The conductor/insulator stack 148 is between the semiconductor layer and the conductor/insulator stack 149.

Figure 28:
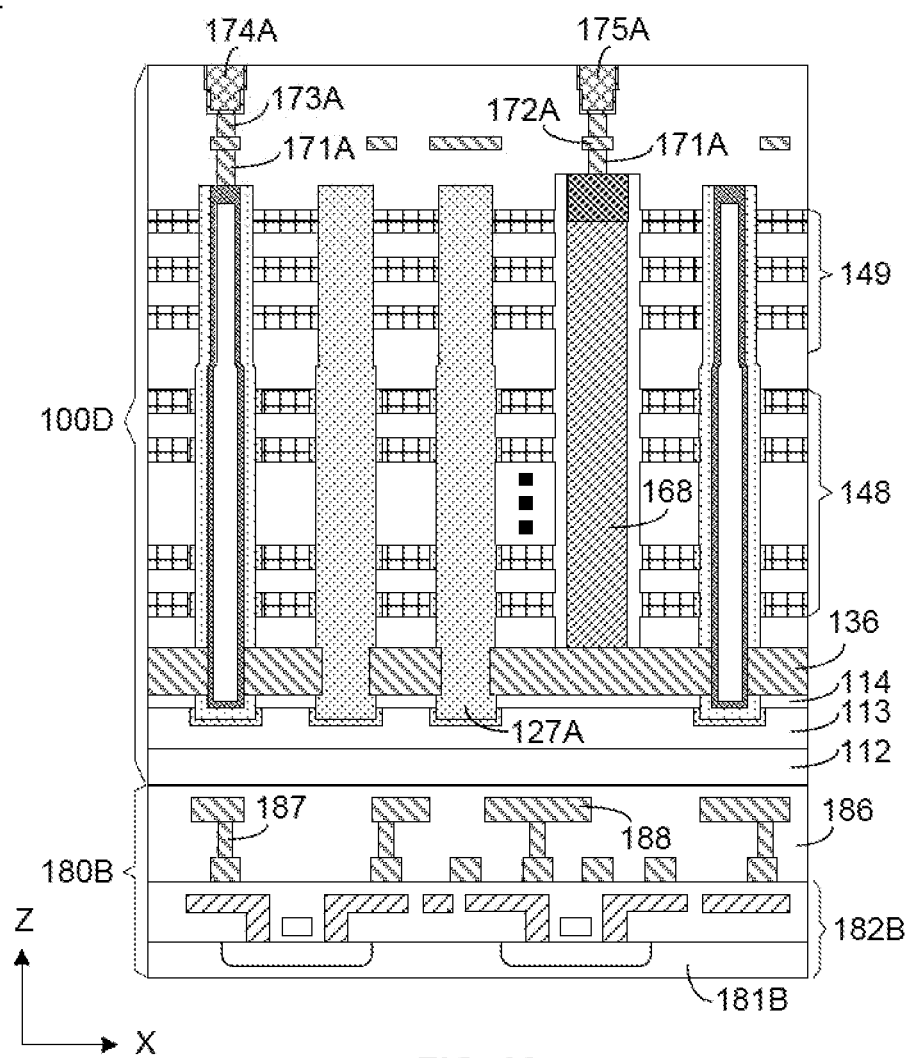
FIG. 28 illustrates a cross-sectional view of another 3D memory device at a certain stage in another fabrication process according to various aspects of the present disclosure.

FIG. 28 schematically shows a cross-sectional view of an exemplary 3D memory device 191 at a certain stage of a fabrication process in according to aspects of the present disclosure. The device 191 represents memory devices that have an alternative structure and are made with certain methods different from those illustrated above. The 3D memory device 191 may have a 3D array device 100D and a periphery device 180B that are integrated together. The periphery device 180B may be made first, and the 3D array device 100D may be fabricated using the device 180B as a substrate component.

The periphery device 180B contains a substrate 181B and periphery CMOS circuits 182B on the substrate 181B. A dielectric layer 186 covers the periphery CMOS circuits 182B. Vias 187 and conductor layers 188 are formed in the dielectric layer 186. The dielectric layer 186 includes one or more dielectric materials such as silicon oxide and silicon nitride.

After the periphery device 180B is made, a flattening process is performed and a dielectric material (e.g., silicon oxide or silicon nitride) is deposited to from a layer 112 over the layer 186. Further, layers 113-114 and a sacrificial layer (not shown) are grown sequentially. The layer 113 may be silicon nitride optionally. The layer 114 is cover layer (e.g., an aluminum oxide layer). The sacrificial layer may be polysilicon exemplarily. Further processes may be similar to that used to make the structure 100C of FIG. 24 and 3D array device 100C1 of FIG. 25.

For example, a first and second dielectric stack similar to the stacks 140 and 143 of FIG. 21 are made. Dielectric filling structures 127A and channel hole structures are formed and extend through the dielectric stacks. The sacrificial layer is removed and replaced by a semiconductor layer 136. The first and second dielectric stacks are converted into conductor/insulator stacks 148 and 149. A conductive structure 168 is made as an array common source. Vias 171A, conductor layers 172A, vias 173A, contact pads 174A and 175A are deposited, respectively. With reference to FIGS. 1A and 28, the dielectric filling structures 127A are dummy channel hole structures 151 and 152. The channel hole structure 153 is used for creating memory cells. The channel hole structure 154 is a dummy and used for mechanical support. The 3D memory device 191 has enhanced yield and reliability for reasons described above.

Figure 29:
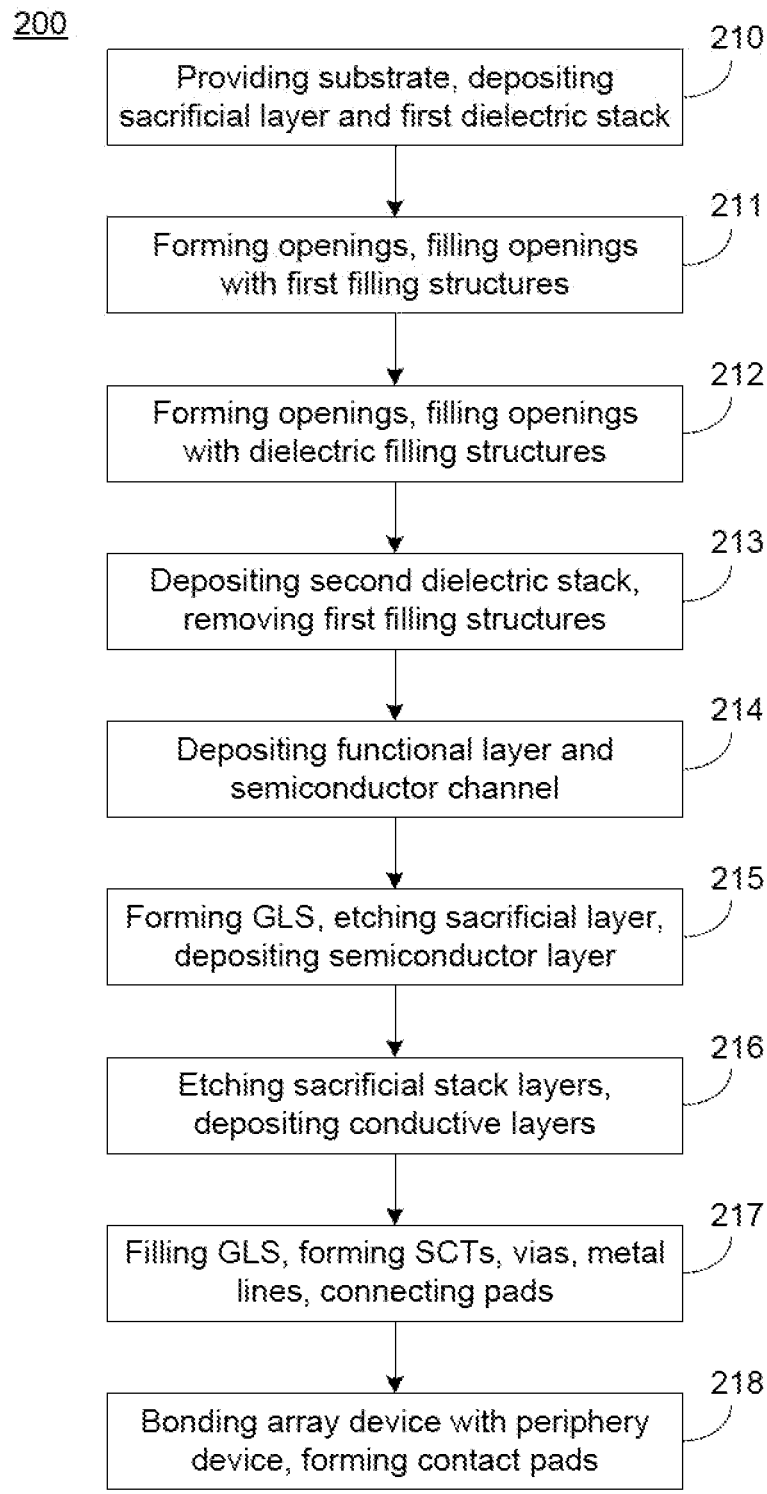
FIG. 29 illustrates a schematic flow chart of fabrication of a 3D memory device according to various aspects of the present disclosure.

FIG. 29 shows a schematic flow chart 200 for fabricating a 3D memory device according to aspects of the present disclosure. At 210, a substrate is provided for fabricating a 3D array device. A sacrificial layer is deposited over a top surface of the substrate. The substrate includes a semiconductor substrate, such as a single crystalline silicon substrate. The sacrificial layer may include single crystalline silicon, polysilicon, silicon oxide, or silicon nitride.

Over the sacrificial layer, a first dielectric stack is fabricated. The first dielectric stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer.

With certain alternative methods, a multi-layer including, e.g., a silicon oxide layer, silicon nitride layer, and polysilicon layer may be deposited between the sacrificial layer and first dielectric stack. The polysilicon layer may be the top of the multi-layer.

At 211, openings are etched at positions arranged for channel hole structures. The openings extend through the first dielectric stack and the sacrificial layer to expose portions of the substrate. A deposition process is performed to deposit a material (e.g., polysilicon) and form first filling structures in the openings.

At 212, some first filling structures are removed in a selective etch, and then filled with a dielectric material such as silicon oxide to form dielectric filling structures. The dielectric filling structures are arranged adjacent to positions of certain GLS structures. Optionally, the GLS structures form the boundary of a memory cell region.

At 213, a second dielectric stack is deposited. The second dielectric stack is formed over and aligned to the first dielectric stack. The second dielectric stack includes a third stack layer and a fourth stack layer that are alternately stacked. The third stack layer includes the first dielectric layer and the fourth stack layer includes the second dielectric layer.

Openings are etched at positions arranged for the channel hole structures. The openings extend through the second dielectric stack, and expose the first filling structures and dielectric filling structures at the bottoms. The exposed first filling structures are removed in a selective etch and certain openings are extended to pass through the first and second dielectric stacks. The dielectric filling structures remain there after the selective etch. All of the openings, extending through the second dielectric stack or both stacks, may be considered as channel holes.

At 214, a functional layer is deposited on the sidewall and bottom surface of the channel hole. The functional layer includes a blocking layer, a charge trap layer, and a tunneling layer that are grown sequentially. Thereafter, a semiconductor channel is deposited on a surface of the tunneling layer.

At 215, a GLS is formed by etch. Along a direction vertical to the substrate, the GLS extends through the first and second dielectric stacks. At the bottom of the GLS, the sacrificial layer is exposed. In some embodiments, the sacrificial layer is etched away and a cavity is created above the substrate. The cavity exposes a bottom portion of the functional layer in the cavity. Layers of the functional layer exposed sequentially in the cavity, including the blocking layer, the charge trap layer, and the tunneling layer, are etched away, respectively. Portions of the semiconductor channels are exposed in the cavity.

Thereafter, a deposition process is performed to grow a semiconductor layer such as a polysilicon layer in the cavity. The semiconductor layer contacts the semiconductor channels and the substrate.

In some aspects, the two dielectric stacks include sacrificial stack layers. The sacrificial stack layers are etched away at 216 to leave cavities in the first and second dielectric stacks.

In the alternative methods, the GLS is formed to expose the polysilicon layer of the multi-layer at the bottom and the sacrificial stack layers on the sidewall. The sacrificial stack layers are then etched away to form cavities in the first and second dielectric stacks.

The cavities are filled with conductive materials to form conductive layers. The first and second dielectric stacks are transformed into first and second conductor/insulator stacks, respectively.

At 217, a dielectric layer is deposited on the sidewall and bottom surface of the GLS. The dielectric layer on the bottom surface is etched out to expose the semiconductor layer. Conductive materials, such as TiN, W, Cu, Al, and/or doped polysilicon are deposited in the GLS to form an array common source that contacts the semiconductor layer. In the alternative methods, the GLS is filled with dielectric materials. The filled GLS becomes the GLS structure. In some aspects, the GLS structure is arranged to separate a memory cell region and a non-memory region where memory cells are not configured. A dummy channel hole structure is in the memory cell region, has the dielectric filling structure through the first conductor/insulator stack, and is adjacent to the GLS structure. Optionally, another dummy channel hole structure is in the non-memory region, and adjacent to the GLS structure.

Further, etching and deposition processes are performed to form SCTs that are connected with the word lines. Thereafter, vias, conductor layers such as metal lines, connecting pads are formed for interconnect. The SCTs, vias, metal lines, and connecting pads may contain a conductive material such as W, Co, Cu, and/or Al.

At 218, a 3D memory device is fabricated. In some aspects, a flip-chip bonding process is performed to bond the 3D array device and a periphery device to create the 3D memory device. Alternatively, a periphery device is made first, and the 3D array device is formed over the periphery device, creating an integrated 3D memory device. Referring to the flip-chip process, the 3D array device is flipped upside down and positioned above the periphery device. The connecting pads of the 3D array device and the periphery device are aligned and then bonded. After the substrate of the 3D array device is thinned, etching and deposition processes are performed to form vias, conductor layers, and contact pads. The contact pads are configured for wire bonding for connection with other devices.

Because the dielectric filling structure is configured at the bottom part of the channel hole structure and adjacent to the GLS structure, the risk of leakage between word lines may be reduced. The yield and reliability may be improved.

Figure 30:
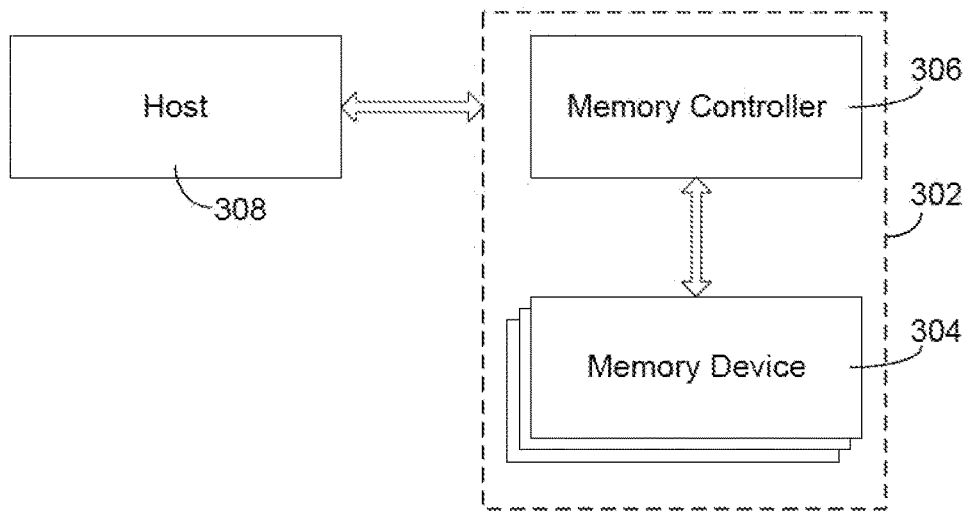
FIG. 30 illustrates a block diagram of an exemplary system having memory devices according to various embodiments of the present disclosure.

FIG. 30 shows a block diagram of an exemplary system 300 having a memory device according to various aspects of the present disclosure. The system 300 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 30, the system 300 may include a host 308 and a memory system 302 having one or more memory devices 304 and a memory controller 306. The host 308 may be a processor of an electronic device, such as a central processing unit (CPU), or a system-on-chip (SoC), such as an application processor (AP). The host 308 may be configured to send or receive data to or from the memory devices 304.

The memory controller 306 is coupled to the memory devices 304 and host 308 and is configured to control the memory devices 304, according to some implementations. The memory controller 306 may manage the data stored in the memory devices 304 and communicate with the host 308. In some embodiments, the memory controller 306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 306 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 306 may be configured to control operations of the memory device 304, such as read, erase, and program operations.

The memory controller 306 may also be configured to manage various functions with respect to the data stored or to be stored in the memory device 304 including, but not limited to bad-block management, garbage collection, logical-to-physical address conversion, wear leveling, etc. In some implementations, the memory controller 306 is further configured to process error correction codes (ECCs) with respect to the data read from or written to the memory device 304. Any other suitable functions may be performed by the memory controller 306 as well, for example, formatting the memory device 304. The memory controller 306 may communicate with an external device (e.g., the host 308) according to a particular communication protocol. For example, the memory controller 306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory device 304 may be any memory device disclosed in the present disclosure, such as the 3D memory device 190 or 191 shown in FIG. 27 or 28. As the 3D memory devices 190 and 191 may have improved yield and reliability due to the reasons described above, when the device 190 or 191 is used, the system 300 may have improved yield and reliability, as well.

Figure 31:
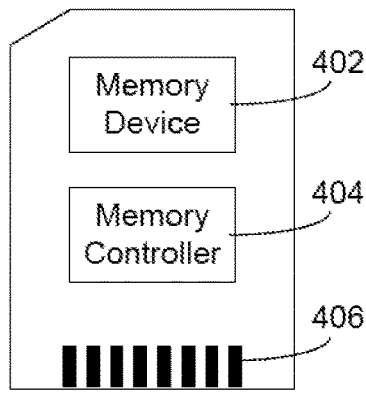
FIG. 31 illustrates a diagram of an exemplary memory card having a memory device according to various aspects of the present disclosure.
Figure 32:
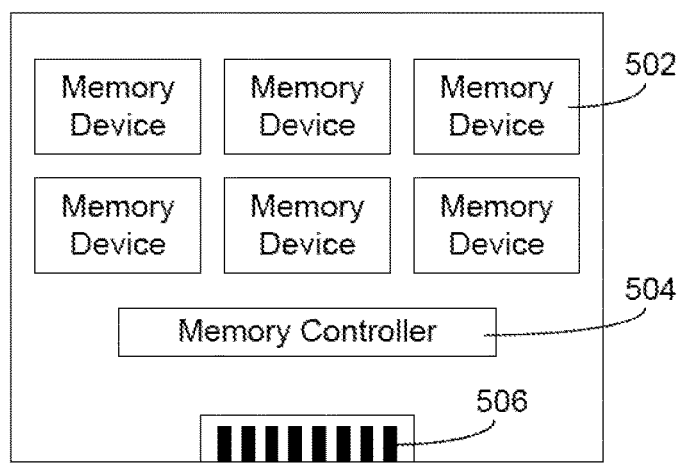
FIG. 32 illustrates a diagram of an exemplary solid-state drive (SSD) having memory devices according to various aspects of the present disclosure.

The memory controller 306 and one or more memory devices 304 may be integrated into various types of storage devices, for example, be included in the same package, such as a universal Flash storage (UFS) package or an eMMC package. That is, the memory system 302 may be implemented and packaged into different types of end electronic products. FIGS. 31 and 32 exemplarily illustrate block diagrams of a memory card 400 and an SSD 500 according to various aspects of the present disclosure. As shown in FIG. 31, a memory controller 404 and a single memory device 402 may be integrated into the memory card 400. The memory device 402 may be any memory device illustrated above, such as the 3D memory device 190 or 191. The memory card 400 may include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. The memory card 400 may further include a memory card connector 406 configured to couple the memory card 400 to a host (e.g., the host 308 shown in FIG. 30). As shown in FIG. 32, a memory controller 504 and multiple memory devices 502 may be integrated into the SSD 500. The memory devices 502 may be any aforementioned memory device, such as the 3D memory device 190 or 191. The SSD 500 may further include an SSD connector 506 configured to couple the SSD 500 to a host (e.g., the host 308 shown in FIG. 30). In some embodiments, the storage capacity and/or the operation speed of the SSD 500 is greater than those of the memory card 400.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A three-dimensional (3D) memory device, comprising:
   a conductor/insulator stack including a conductive layer and a dielectric layer alternatingly stacked;
   a plurality of channel hole structures in a first region of memory cells in the conductor/insulator stack;
   a gate line slit (GLS) structure adjacent to the first region, through the conductor/insulator stack, and extending along a first direction;
   a blocking structure adjacent to the first region, through the conductor/insulator stack, and extending along a second direction, the first and second directions being perpendicular; and
   a first dummy channel hole structure in the first region, the first dummy channel hole structure extending through the conductor/insulator stack, being adjacent to the blocking structure, and including one or more dielectric materials that fill a channel hole to form a first dielectric filling structure.

2. The 3D memory device according to claim 1, wherein the first dielectric filling structure extends through the conductor/insulator stack.

3. The 3D memory device according to claim 1, wherein the conductor/insulator stack includes a first conductor/insulator stack and a second conductor/insulator stack, the first conductor/insulator stack is between a semiconductor layer and the second conductor/insulator stack, and the first dielectric filling structure extends through the first conductor/insulator stack.

4. The 3D memory device according to claim 3, wherein the first dummy channel hole structure includes one of the plurality of channel hole structures extending through the second conductor/insulator stack.

5. The 3D memory device according to claim 1, further comprising:
   a second dummy channel hole structure in a second region separated from the first region by the blocking structure, the second dummy channel hole structure extending through the conductor/insulator stack, being adjacent to the blocking structure, and separated from the first dummy channel hole structure by the blocking structure.

6. The 3D memory device according to claim 5, wherein the second dummy channel hole structure includes a second dielectric filling structure extending through the conductor/insulator stack.

7. The 3D memory device according to claim 1, wherein each channel hole structure comprises:
   a functional layer including a blocking layer, a charge trap layer, and/or a tunneling layer; and
   a semiconductor channel formed over the functional layer.

8. A three-dimensional (3D) memory device, comprising:
   a conductor/insulator stack including a conductive layer and a dielectric layer alternatingly stacked;
   a plurality of channel hole structures in a first region of memory cells in the conductor/insulator stack;
   a gate line slit (GLS) structure adjacent to the first region and extending along a first direction;
   a blocking structure separating the first region and a second region and extending along a second direction, the first and second directions being perpendicular; and
   a first dummy channel hole structure in the first region, the first dummy channel hole structure including one or more dielectric materials that fill a channel hole to form a first dielectric filling structure.

9. The 3D memory device according to claim 8, wherein the first dummy channel hole structure is adjacent to the blocking structure.

10. The 3D memory device according to claim 8, wherein the first dielectric filling structure extends through the conductor/insulator stack.

11. The 3D memory device according to claim 8, wherein the conductor/insulator stack includes a first conductor/insulator stack and a second conductor/insulator stack formed over the first conductor/insulator stack, and the first dielectric filling structure extends through the first conductor/insulator stack.

12. The 3D memory device according to claim 8, further comprising:
- a second dummy channel hole structure in the second region, the second dummy channel hole structure extending through the conductor/insulator stack, being adjacent to the blocking structure, and separated from the first dummy channel hole structure by the blocking structure.

13. The 3D memory device according to claim 12, wherein the second dummy channel hole structure includes a second dielectric filling structure extending through the conductor/insulator stack.

14. The 3D memory device according to claim 8, wherein each channel hole structure comprises:
- a functional layer including a blocking layer, a charge trap layer, and/or a tunneling layer; and
- a semiconductor channel formed over the functional layer.

* * * * *